United States Patent
Ban et al.

(10) Patent No.: US 8,962,491 B2
(45) Date of Patent: Feb. 24, 2015

(54) METHODS OF FABRICATING SEMICONDUCTOR DEVICES AND SEMICONDUCTOR DEVICES FABRICATED THEREBY

(71) Applicant: SK Hynix Inc., Icheon (KR)

(72) Inventors: Keun Do Ban, Yongin (KR); Jung Gun Heo, Icheon (KR); Cheol Kyu Bok, Pohang (KR); Myoung Soo Kim, Seongnam (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/139,502

(22) Filed: Dec. 23, 2013

(65) Prior Publication Data

US 2015/0031185 A1    Jan. 29, 2015

(30) Foreign Application Priority Data

Jul. 25, 2013   (KR) .................. 10-2013-0088353

(51) Int. Cl.
*H01L 21/302*   (2006.01)
*H01L 21/308*   (2006.01)
*H01L 27/24*    (2006.01)
*H01L 27/108*   (2006.01)

(52) U.S. Cl.
CPC ............ *H01L 21/3086* (2013.01); *H01L 27/24* (2013.01); *H01L 27/10844* (2013.01); *H01L 21/3081* (2013.01); *H01L 21/3088* (2013.01)
USPC .......................................... 438/736; 438/780

(58) Field of Classification Search
USPC ........................................ 438/735, 736, 780
See application file for complete search history.

(56) References Cited

U.S. PATENT DOCUMENTS

| | | | |
|---|---|---|---|
| 2010/0297847 A1 | 11/2010 | Cheng et al. | |
| 2012/0107583 A1* | 5/2012 | Xiao et al. | 428/210 |
| 2013/0068719 A1* | 3/2013 | Bonhote et al. | 216/2 |
| 2014/0097520 A1* | 4/2014 | Millward | 257/622 |

FOREIGN PATENT DOCUMENTS

KR   10-2010-0079948 A   7/2010

* cited by examiner

*Primary Examiner* — Bradley K Smith

(57) ABSTRACT

The method includes forming an array of first separation walls on an underlying layer. A block co-polymer (BCP) layer is formed to fill inside regions of the first separation walls and gaps between the first separation walls. The BCP layer is phase-separated to include first domains that provide second separation walls covering inner sidewalls and outer sidewalls of the first separation walls and second domains that are separated from each other by the first domains.

20 Claims, 43 Drawing Sheets

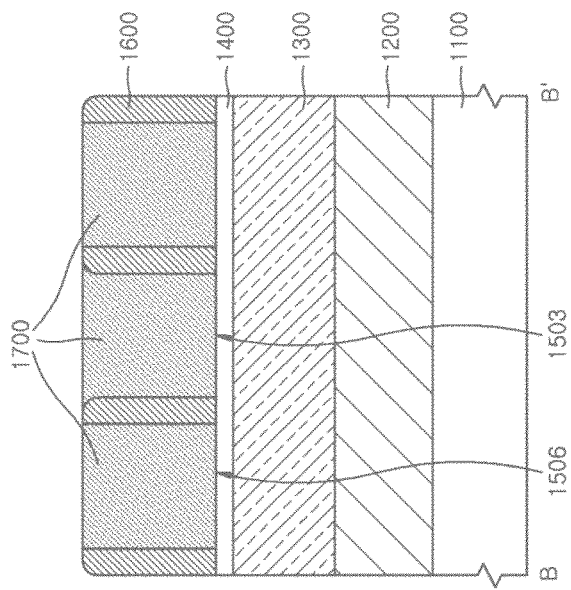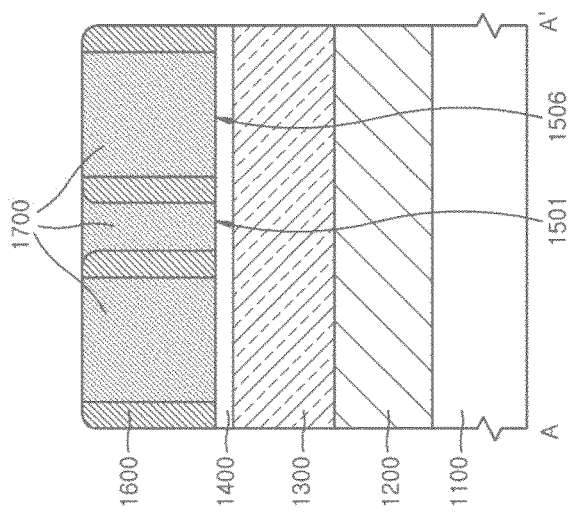

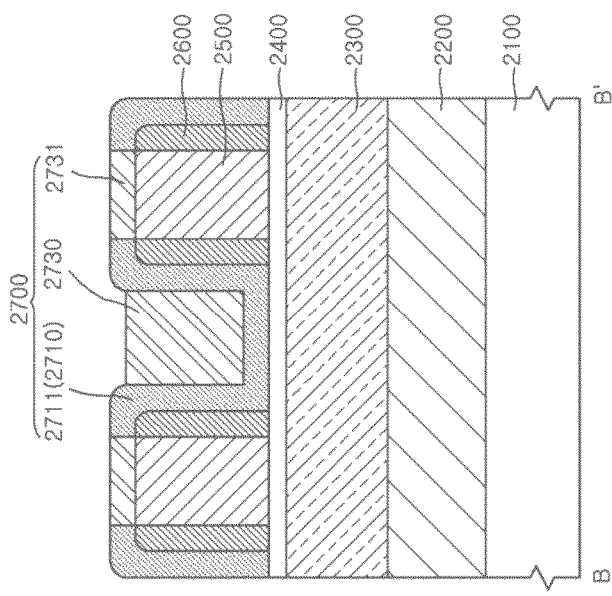
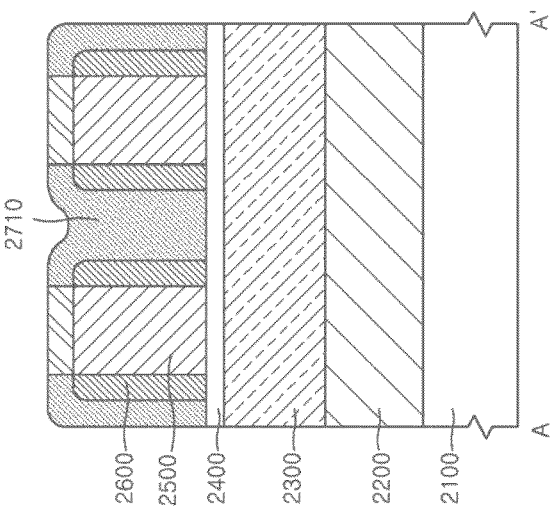

METHODS OF FABRICATING SEMICONDUCTOR DEVICES AND SEMICONDUCTOR DEVICES FABRICATED THEREBY

CROSS-REFERENCE TO RELATED APPLICATION

The present application claims priority under 35 U.S.C 119(a) to Korean Application No. 10-2013-0088353, filed on Jul. 25, 2013, in the Korean Intellectual Property Office, which is incorporated by reference in its entirety as set forth in full.

BACKGROUND

1. Technical Field

Embodiments of the present disclosure relate to methods of fabricating a semiconductor device, and more particularly, to methods of fabricating a semiconductor device having an array of fine patterns and semiconductor devices fabricated thereby.

2. Related Art

In fabrication of electronic devices such as semiconductor devices, many efforts have been focused to integrate more patterns in a limited area of a semiconductor substrate. That is, attempts to increase the integration density of the electronic devices or the semiconductor devices have typically resulted in formation of fine patterns. Various techniques have been proposed to form the fine patterns such as small contact holes having a nano-scaled critical dimension (CD), for example, a size of about a few nanometers to about several tens of nanometers.

In the event that the fine patterns of the semiconductor devices are formed using only a photolithography process, there may be some limitations in forming the fine patterns due to image resolution limits of lithography apparatuses used in the photolithography process. Methods of forming the fine patterns using a self-assembly of polymer molecules may be considered as an alternative for overcoming the image resolution limits of optical systems used in the photolithography process and for avoiding constraints arising from wavelengths of lights generated from light sources of optical systems used in the photolithography process. However, the methods of forming the fine patterns using the self-assembly technique are still under development. Thus, there may be still some difficulties in forming the fine patterns of highly integrated semiconductor devices using the self-assembly technique.

SUMMARY

Various embodiments are directed to methods of fabricating semiconductor devices and semiconductor devices fabricated thereby.

According to some embodiments, a method of fabricating a semiconductor device includes forming an array of pillars on an underlying layer, forming a separation wall layer on the pillars and the underlying layer to provide first separation walls on sidewalls of the pillars, forming a block co-polymer (BCP) layer on the separation wall layer to fill gaps between the pillars, and phase-separating the BCP layer into first domains including second separation walls on the first separation walls and second domains separated from the pillars by the first domains.

According to further embodiments, a method of fabricating a semiconductor device includes forming an array of pillars on an underlying layer, forming first separation walls on sidewalls of the pillars, forming a block co-polymer (BCP) layer filling gaps between the pillars, and phase-separating the BCP layer into first domains including second separation walls on the first separation walls and second domains separated from the pillars by the first domains.

According to further embodiments, a method of fabricating a semiconductor device includes forming an array of first separation walls on an underlying layer. Each of the first separation walls is formed to have a cylindrical shape. A block co-polymer (BCP) layer is formed to fill inside regions of the first separation walls and gaps between the first separation walls. The BCP layer is phase-separated to include first domains that provide second separation walls covering inner sidewalls and outer sidewalls of the first separation walls and second domains that are separated from each other by the first domains.

According to further embodiments, a semiconductor device includes an array of pillars on an underlying layer, a separation wall layer including first separation walls covering sidewalls of the pillars, and a block co-polymer (BCP) layer formed on the separation wall layer to fill gaps between the pillars. The BCP layer is phase-separated to include first domains that provide second separation walls covering the first separation walls and second domains that are separated from each other by the first domains.

According to further embodiments, a semiconductor device includes an array of first separation walls on an underlying layer. Each of the first separation walls has a cylindrical shape. A block co-polymer (BCP) layer fills inside regions of the first separation walls and gaps between the first separation walls. The BCP layer is phase-separated to include first domains that provide second separation walls covering inner sidewalls and outer sidewalls of the first separation walls and second domains that are separated from each other by the first domains.

According to further embodiments, a method of fabricating a semiconductor device includes forming first and second sacrificial pillars over an underlying layer, forming first separation walls over sidewalls of the first and the second sacrificial pillars, respectively, filling a copolymer between the first separation walls, subject the copolymer to a phase-separation to convert the copolymer into first and second domains, wherein the first domain is formed in a lining pattern along the first separation walls, wherein the second domain includes remaining copolymer, removing the second domain to form a first contact hole exposing the underlying layer, removing the first and second sacrificial pillars to form second contact holes exposing the underlying layer, and patterning the exposed underlying layer using the first separation walls and the first domain as a mask.

The first contact hole has substantially a same width as the second contact holes.

A minimum pattern size available under a given condition is X. and a distance between the first contact hole and any of the second contact holes is less than the minimum pattern size X.

Each of the sacrificial pillars has the minimum pattern size.

According to further embodiments, a method of fabricating a semiconductor device includes forming first and second sacrificial pillars over an underlying layer, forming first separation walls over sidewalls of the first and the second sacrificial pillars, respectively, removing the first and second sacrificial pillars to form first contact holes, filling a copolymer (i) between the first separation walls and (i) in the first contact holes, subject the copolymer to phase-separation to convert the copolymer into first and second domains, wherein the first domain is formed in a lining pattern along the first separation walls, wherein the second domain includes the remaining copolymer, removing the second domain to form second contact holes exposing the underlying layer, patterning the exposed underlying layer using the first separation walls and the first domain as a mask.

BRIEF DESCRIPTION OF THE DRAWINGS

Embodiments will become more apparent in view of the attached drawings and accompanying detailed description.

FIGS. 1 to 20B are schematic views illustrating a method of fabricating a semiconductor device according to an embodiment;

FIGS. 21 to 34B are schematic views illustrating a method of fabricating a semiconductor device according to another embodiment;

FIGS. 35 to 38B are schematic views illustrating a method of fabricating a semiconductor device according to still another embodiment;

DETAILED DESCRIPTION OF THE EMBODIMENTS

Various embodiments may provide methods of fabricating fine patterns of semiconductor devices by self-assembling domains of a block co-polymer (BCP) material. Phase-separated domains of the BCP material may be spontaneously self-assembled to produce fine structures in which the domains are repeatedly arrayed. In the event that fine patterns are formed using a self-assembly of the domains of the BCP material, the fine patterns may be realized to have a similar size to a thickness of a single molecular layer. As a result, the resolution limits of the photolithography process may be overcome by the self-assembly of the domains of the BCP material.

Some embodiments may be used in formation of cell contact holes for arraying storage nodes comprising cell capacitors of dynamic random access memory (DRAM) devices. In such a case, the cell contact holes may be formed to have a uniform size and may be repeatedly arrayed. That is, the cell contact holes may be formed to have a uniform size and a uniform shape throughout a cell array region of the DRAM device. Further, the methods according to some embodiments may also be applied to formation of cell contact holes for arraying nano-sized fine nodes disposed in cell array regions of phase changeable random access memory (PcRAM) devices or resistive random access memory (ReRAM) devices. In addition, the methods according to some embodiments may be used in fabrication of fine patterns which are regularly and repeatedly arrayed in memory devices such as static random access memory (SRAM) devices, flash memory devices, magnetic random access memory (MRAM) devices and ferroelectric random access memory (FeRAM) devices or in logic devices.

It will be understood that although the terms first, second, third etc. may be used herein to describe various elements, these elements should not be limited by these terms. These terms may only be used to distinguish one element from another element, rather than to describe some temporal or other aspect. Thus, a first element in some embodiments could be termed a second element in other embodiments without departing from the teachings of the embodiments. As used herein, the term "and/or" includes any and all combinations of one or more of the associated listed items.

It will also be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like are not intended to limit the scope of the embodiments.

Figure 1:
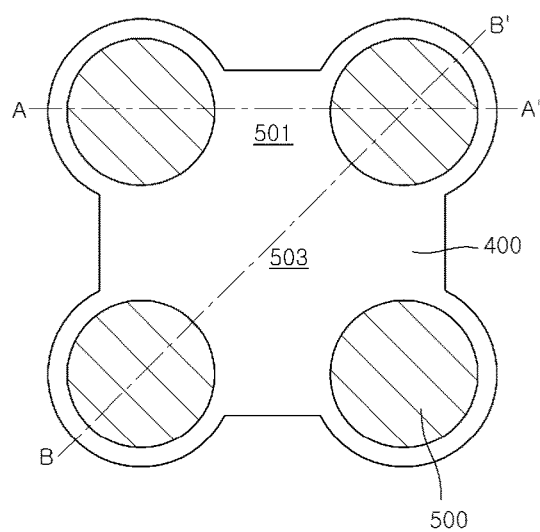
Figure 2:
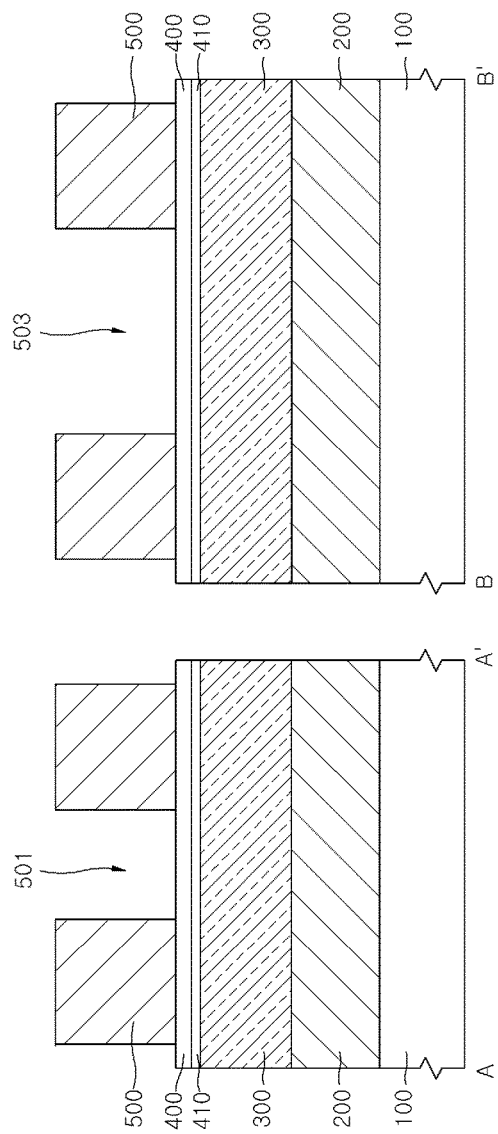

FIG. 1 is a plan view illustrating an array of pillars (or sacrificial pillars) 500, and FIGS. 2A and 2B are cross-sectional views taken along lines A-A' and B-B' of FIG. 1, respectively referring to FIGS. 1, 2A, and 2B, the pillars 500 may be arranged such that four pillars are located at four vertices of a tetragon. First gaps 501 may be disposed between the pillars 500 adjacent to each other in a row or in a column, and a second gap 503 may be disposed between the pillars 500 adjacent to each other in a diagonal direction. That is, one of the first gaps 501 may be shown in a cross-sectional view taken along the line A-A' which is parallel with a row, and the second gap 503 may be shown in a cross-sectional view taken along the line B-B' which is parallel with a diagonal direction. Accordingly, a width of the second gap 503 may be greater than that of the first gaps 501. Since the four pillars 500 are respectively located at four vertex of a tetragon, the second gap 503 may be disposed in a central region of the tetragon. Although, in the particular example of FIG. 1 the pillars 500 are located at four vertex of a tetragon, embodiments are not limited thereto. For example, the pillars 500 may include three pillars and the three pillars may be located at three vertex of a triangle.

The pillars 500 may be formed on an underlying layer 400 disposed over a semiconductor substrate 100. Before forming the underlying layer 400, an etch target layer 200 and a hard mask layer 300 may be sequentially formed over the semiconductor substrate 100.

The etch target layer 200 may be formed of an interlayer insulation layer including, e.g., a silicon oxide layer such as a tetra-ethyl-othor-silicate (TEOS) layer having a thickness of about 2200 angstroms. The etch target layer 200 may be used to insulate storage node contacts penetrating therethrough from each other. The storage node contacts may electrically connect storage nodes of cell capacitors of a DRAM device to the semiconductor substrate 100 or to cell transistors (not shown) formed in the semiconductor substrate 100. Alternatively, the etch target layer 200 may act as a mold sacrificial layer for contact holes defining shapes of the storage nodes of the cell capacitors penetrate. In ReRAM devices, the etch target layer 200 may be used as an interlayer insulation layer that underlying electrodes contacting variable resistive layers penetrate.

The hard mask layer 300 may be formed to include an amorphous carbon layer (e.g. having a thickness of about 1500 angstroms). The hard mask layer 300 may be used as an etch mask layer when the etch target layer 200 is patterned to form contact holes in a subsequent process. The underlying layer 400 may be formed on the hard mask layer 300. The underlying layer 400 may be used as an etch mask layer when the hard mask layer 300 is patterned in a subsequent process. The underlying layer 400 may be formed to include a silicon oxynitride (SiON) layer having a thickness of about 200 angstroms. In some embodiments, an interfacial layer 410 may be additionally formed between the hard mask layer 300 and the underlying layer 400, and the interfacial layer 410 may include a silicon oxide ($SiO_x$) layer such as an undoped silicate glass (USG) layer having a thickness of about 200 angstroms. The interfacial layer 410 may correspond to the underlying layer 400. In such a case, the underlying layer 400 may include a single layer of silicon oxynitride (SiON) material or include a combination layer of a SiON layer and a USG layer on the SiON layer or a combination layer of a USG layer and a SiON layer on the USG layer.

A pillar layer for providing the pillars 500 may be formed on the underlying layer 400 and include a high temperature spin on carbon (SOC) layer having a thickness of about 800 angstroms. The pillar layer may be patterned to form an array of the pillars 500. Specifically, the array of the pillars 500 may be formed by coating a photoresist layer (not shown) on the pillar layer, patterning the photoresist layer using a photolithography process to form a photoresist pattern, and etching the pillar layer using the photoresist pattern as an etch mask. A bottom anti-reflective coating (BARC) layer (not shown) having a thickness of about 230 angstroms may be formed between the pillar layer and the photoresist layer to enhance a resolution of the photolithography process. An interfacial layer such as an SiON layer having a thickness of about 300 angstroms may be additionally formed between the BARC layer and the pillar layer. The pillars 500 may be formed using a single patterning technology utilizing a photolithography process. Alternatively, the pillars 500 may be formed using a spacer patterning technology or a double patterning technology to obtain a finer pitch size. For example, the pillars 500 may be formed to have a width (e.g. of about 35 nanometers to about 59 nanometers, for example, about 40 nanometers to about 42 nanometers) using a spacer patterning technology or a double patterning technology.

Figure 3:
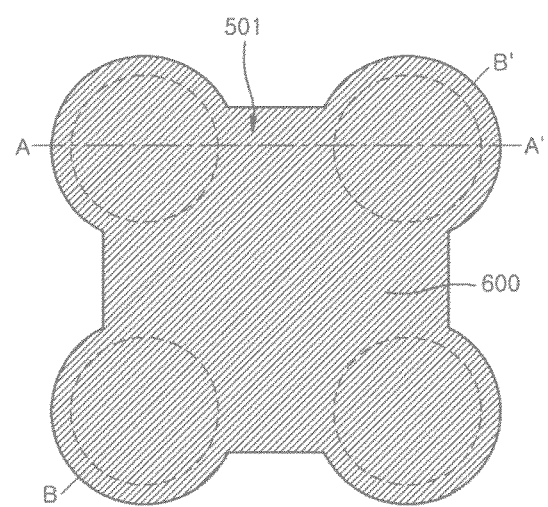
Figure 4:
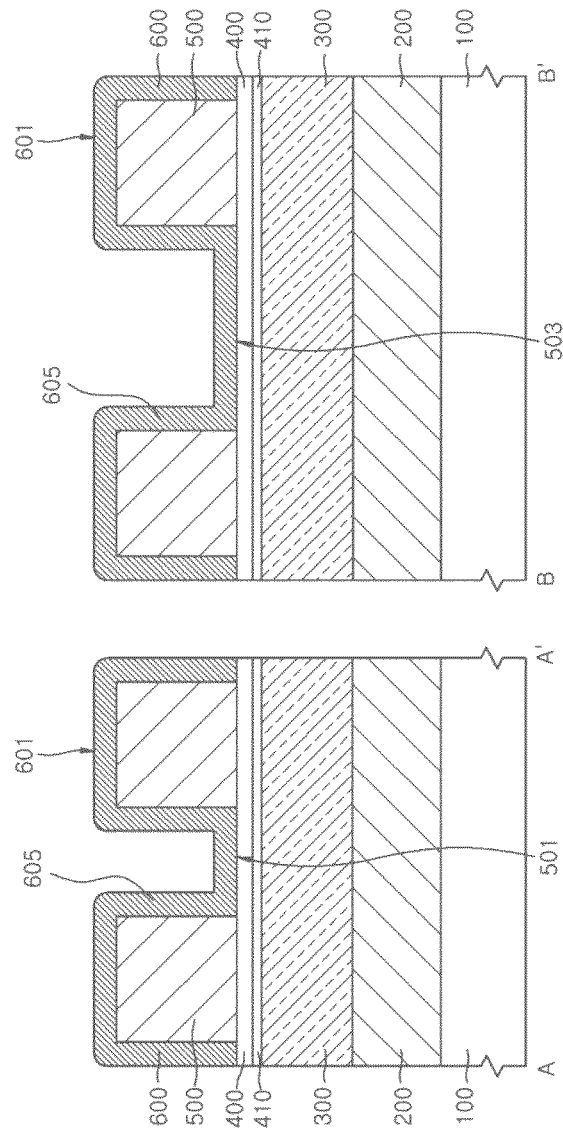

FIG. 3 is a plan view illustrating a step of forming a separation wall layer 600, and FIGS. 4A and 4B are cross-sectional views taken along lines A-A' and B-B' of FIG. 3, respectively. Referring to FIGS. 3, 4a, and 4b, the separation wall layer 600 may be formed to cover an entire surface of the resultant structure where the pillars 500 are formed. The separation wall layer 600 may be formed of an insulation layer having an etch selectivity with respect to the underlying layer 400. For example, the separation wall layer 600 may be formed of an ultra low temperature oxide (ULTO) layer having a thickness of about 200 angstroms. The ULTO layer may have an excellent step coverage. That is, the ULTO layer may be deposited to conformally cover sidewalls and top surfaces of the pillars 500 as well as a surface of the underlying layer 400 exposed between the pillars 500. The separation wall layer 600 deposited on the sidewalls of the pillars 500 will be referred to as a first separation wall portion 605. The separation wall layer 600 disposed over the pillars 500 will be referred to as a portion 601.

Figure 5:
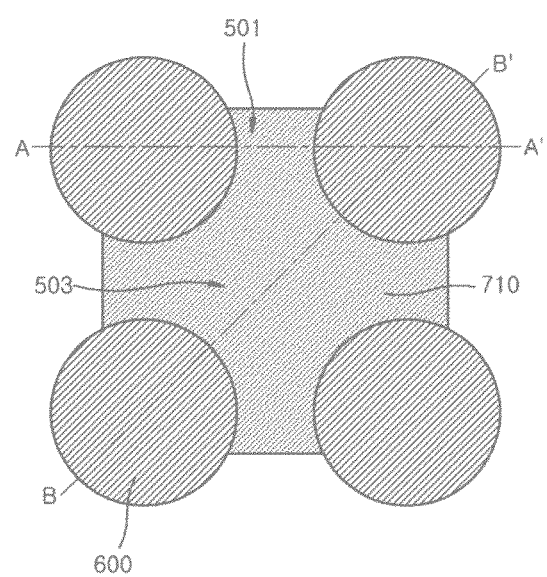
Figure 6A:
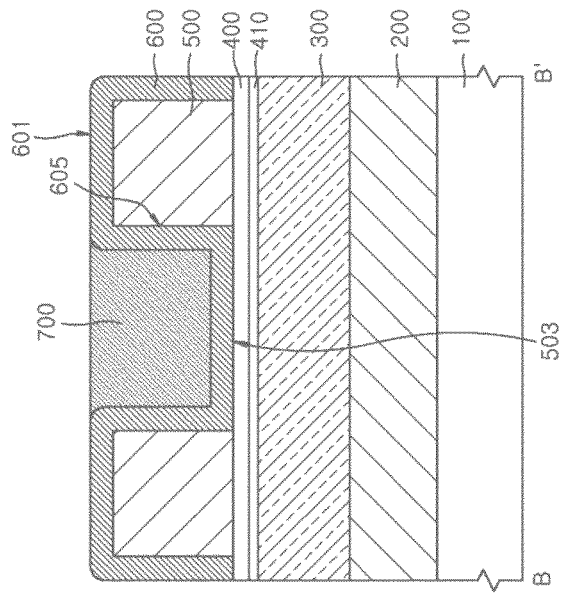
Figure 6B:
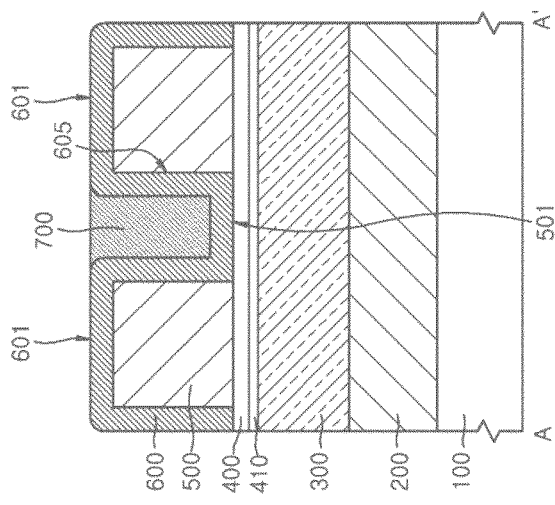

FIG. 5 is a plan view illustrating a step of forming a block co-polymer (BCP) layer 700, and FIGS. 6A and 6B are cross-sectional views taken along lines A-A' and B-B' of FIG. 5, respectively. Referring to FIGS. 5, 6a, and 6b, the BCP layer 700 may be formed on the separation wall layer 600 to fill the first and second gaps (501 and 503 of FIG. 2). The BCP layer 700 may be formed by coating a polystyrene-poly(methyl meta acrylate) (PS-PMMA) co-polymer material or a silicon contained polystyrene-poly(di methyl siloxane) (Si contained PS-PDMS) co-polymer material. The BCP layer 700 may be coated to fill the first and second gaps 501 and 503 and to the portion 601 of the separation wall layer 600 which is located on top surfaces of the pillars 500.

Figure 7:
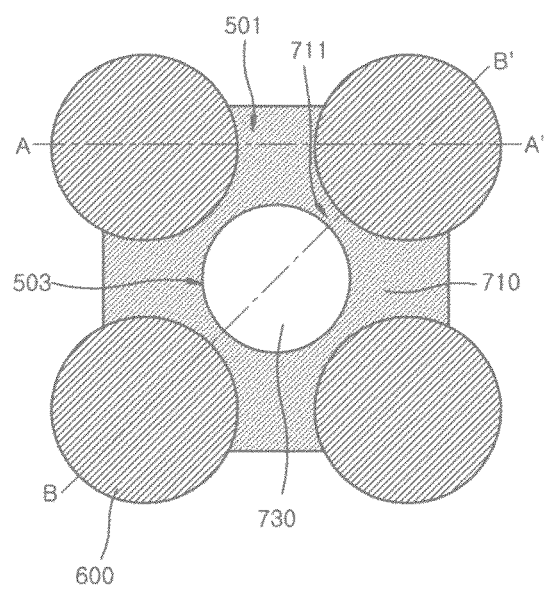
Figure 8:
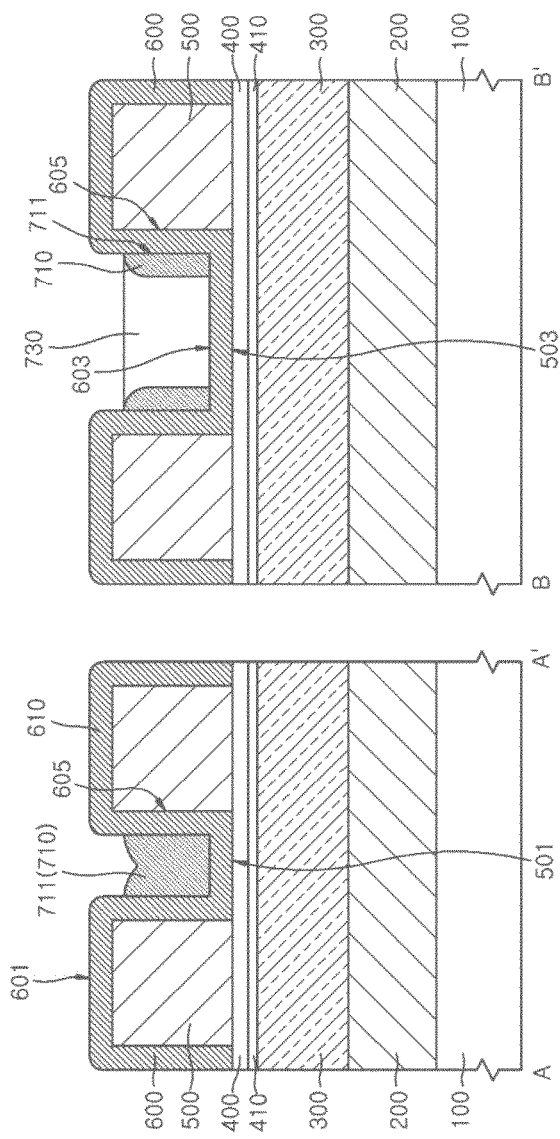

FIG. 7 is a plan view illustrating a step of phase-separating the BCP layer 700, and FIGS. 8A and 8B cross-sectional views taken along lines A-A' and B-B' of FIG. 7, respectively. Referring to FIGS. 7, 8a, and 8b, the BCP layer 700 may be annealed and undergo phase separation. As a result, the BCP layer 700 is separated into first and second domains 710, 730.

The first domain 710 serves as a second separation wall 711 covering the first separation wall portions 605. The second domain 730 is spaced apart from the pillars 500 by the first domain 710. The first domain 710 may be formed to fill the first gaps 501 between the pillars 500 arrayed in a row or in a column direction. Further, the second domain 730 may be formed in a central region surrounded by the four pillars 500 located at four vertex of a tetragon. In such a case, the first domain 710 may extend to cover the separation wall layer 600 on a bottom surface of the second gap 503.

The second domain 730 may be formed to have a post shape. That is, the BCP layer 700 may be phase-separated such that the second domain 730 may be surrounded by the first domain 710. The second domain 730 may be spaced apart from the pillars 500 by the first domain 710. The pillars 500 may be separated from each other by the first domain 710.

The BCP layer 700 may include polystyrene (PS) block component and poly methylmetaacrylate (PMMA) block component, and a volume ratio of the PS to the PMMA may be about 7:3.

Upon phase separation, the first domain 710 may include the PS as a majority component and the second domain 730 may include the PMMA as a majority component.

The BCP layer 700 may be a functional polymer having two or more distinct structured components that may be combined with each other by a covalent bond. The two polymer block components structures may be different from each other in mixing properties and/or solubility due to a difference in chemical structure. These differences may provide a possibility that the BCP layer 700 is phase-separated to form a self-assembled structure.

Forming a nano structure having a specific shape through a self-assembly of the BCP layer 700 may be influenced by a physical property and/or a chemical property of the polymer(s) of the BCP layer 700. When a BCP layer including two distinct polymer blocks is self-assembled on a substrate, the self-assembled structure of the BCP layer may be formed to have a three dimensional cubic shape, a three dimensional double helix shape, a two dimensional hexagonal packed column shape, a two dimensional lamella shape, or another shape, depending on factors such as a volume ratio, an annealing temperature for phase separation, and/or a molecule size of the polymer(s) comprising the BCP layer.

A size of each polymer block in the various self-assembled structures may be proportional to a molecular weight of the corresponding polymer block. The separation wall layer 600 may function as a guide layer inducing a self-assembly of the domains of the BCP layer 700 in order to align the polymer block(s) of the BCP layer 700.

In some embodiments, the BCP layer 700 may include polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylatepolyvinylpyridine co-polymer, polyisobutylene-polybutylmethacrylate co-polymer, polyisobutylene-polymethylmethacrylate co-polymer, polyisobutylene-polybutylmethacrylate co-polymer, polyisobutylenepolydimethylsiloxane co-polymer, polybutylmethacrylatepolybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridinepolymethylmethacrylate co-polymer, polyethyleneoxide-polyisoprene co-polymer, polyethyleneoxide-polybutadiene co-polymer, polyethyleneoxide-polystyrene co-polymer, polyethyleneoxidepolymethylmethacrylate co-polymer, polyethyleneoxide-polydimethylsiloxane co-polymer, or polystyrene-polyethyleneoxide co-polymer. In other embodiments, the BCP layer 700 may include a tri-block co-polymer material having three distinct polymer blocks.

In order to rearrange and align the polymer blocks of the BCP layer 700 through a phase separation of the BCP layer 700, the BCP layer 700 may be annealed at a temperature exceeding the glass transition temperature Tg of each of the blocks of the BCP layer 700. For example, the BCP layer 700 may be annealed at a temperature of about 100 degrees Celsius to about 190 degrees Celsius for about one hour to about twenty four hours to rearrange and align the polymer blocks of the BCP layer 700.

Referring again to FIGS. 7, 8A, and 8B, the pillars 500 may be formed on the underlying layer 400, and the separation wall layer 600 may be formed to include the first separation wall portions 605 on the sidewalls of the pillars 500. Further, the BCP layer 700 may be formed on the separation wall layer 600 to fill the first and second gaps 501 and 503 between the pillars 500, and the BCP layer 700 may be phase-separated to provide the first domain 710 that corresponds to the second separation wall 711 covering the first separation wall portions 605 and the second domain 730 that is spaced apart from the pillars 500 by the first domain 710. The structure illustrated in FIGS. 7, 8A, 8B may be used in formation of an array of nano-scaled patterns constituting memory devices or logic devices. In such a case, the memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices and ferroelectric random access memory (FeRAM) devices.

Figure 9:
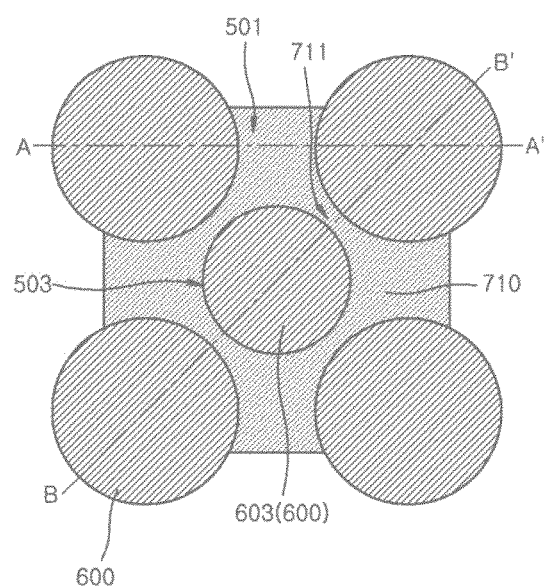
Figure 10A:
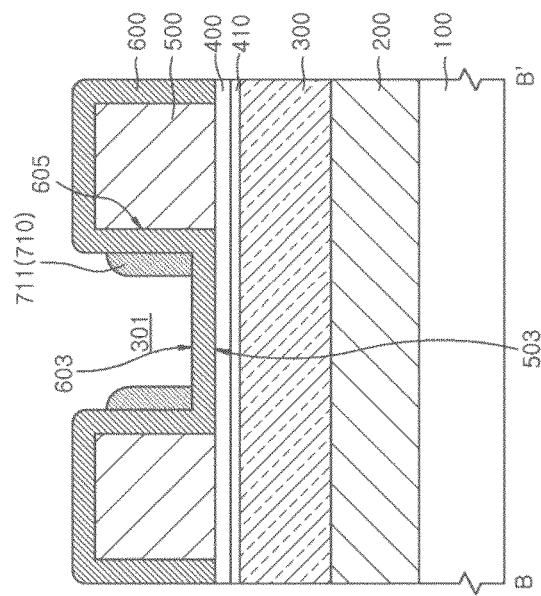
Figure 10B:
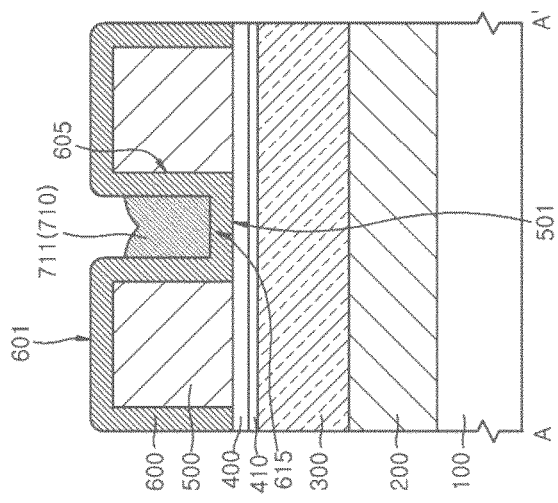

FIG. 9 is a plan view illustrating a step of forming a first opening 301, and FIGS. 10A and 10B are cross-sectional views taken along lines A-A' and B-B' of FIG. 9, respectively. Referring to FIGS. 9, 10A, and 10B, the second domain 730 may be selectively removed to form the first opening 301. That is, the first opening 301 may be formed by selectively removing the PMMA blocks constituting the second domain 730. As illustrated in FIGS. 9, 10A and 10B, a shape of the first opening 301 may be determined by the first domain 710. That is, the first opening 301 may be formed to have a hole shape vertically penetrating a portion of the first domain 710. When the second domain 730 is etched and removed, a portion of the first domain 710 exposed by the first opening 301 may also be removed to expose an extension portion 603 of the separation wall layer 600 located below the first opening 301.

Figure 11:
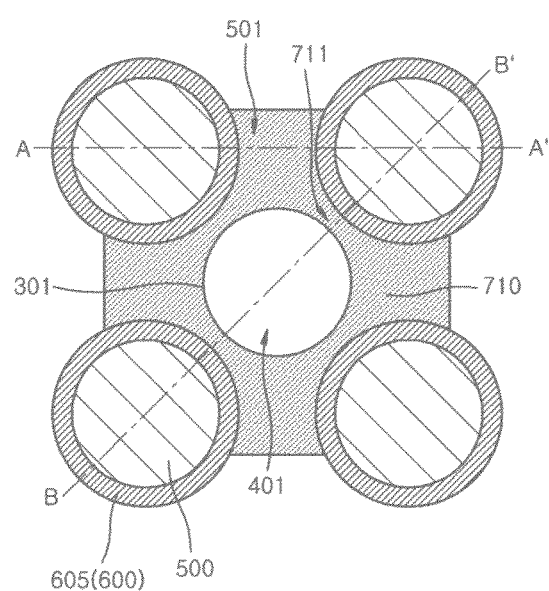
Figure 12:
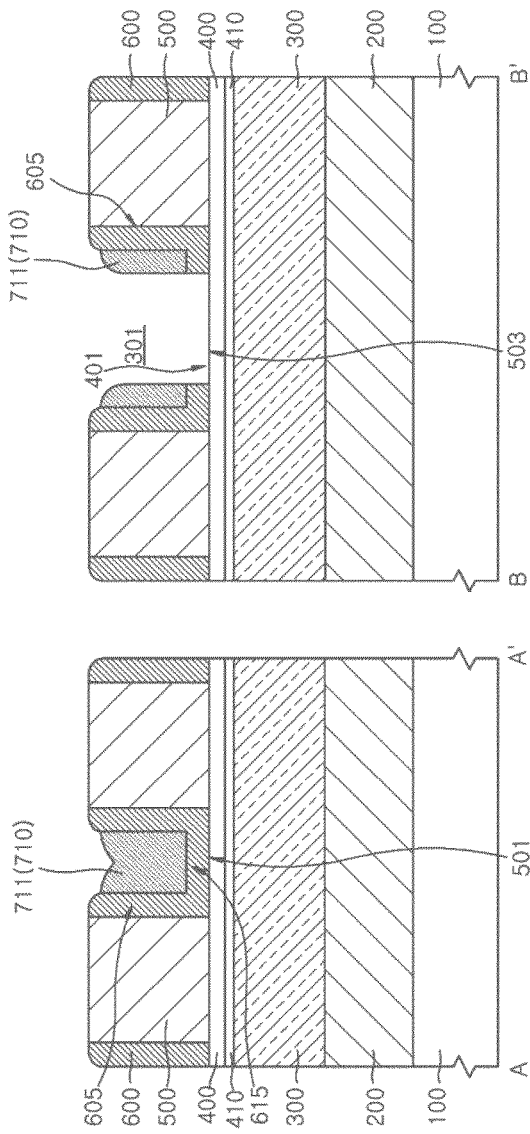

FIG. 11 is a plan view illustrating a step of exposing a first portion 401 of the underlying layer 400 located below the first opening 301, and FIGS. 12a and 12b are cross-sectional views taken along lines A-A' and B-B' of FIG. 11. Referring to FIGS. 11, 12a and 12b, the portions 601 and 603 of the separation wall layer 600 exposed by the first domain 710 may be selectively removed to expose top surfaces of the pillars 500 and the first portion 401 of the underlying layer 400 located below the first opening 301. The portions 601 and 603 of the separation wall layer 600 may be removed by anisotropically etching the separation wall layer 600.

After the portions 601 and 603 of the separation wall layer 600 are removed, portions of the separation wall layer 600 may still remain. For example, portions 615 of the separation wall layer 600 covered with the first domain 710 in the first gaps 501 and the first separation wall portion 605 of the separation wall layer 600 covered with the first domain 710 in the second gap 503 may be remained after the portions 601 and 603 of the separation wall layer 600 are removed. As illustrated in FIGS. 12a and 12b, each of the portions 615 of the separation wall layer 600 may remain to have a 'U'-shaped sectional view. The first separation wall portion 605 of the separation wall layer 600 may remain to have an 'L'-shaped sectional view. A top portion of the first domain 710 may be etched away while the separation wall layer 600 is anisotropically etched to expose the first portion 401 of the underlying layer 400. However, the most part of the first domain 710 may still remain to provide the second separation wall 711 acting as an etch mask.

Figure 13:
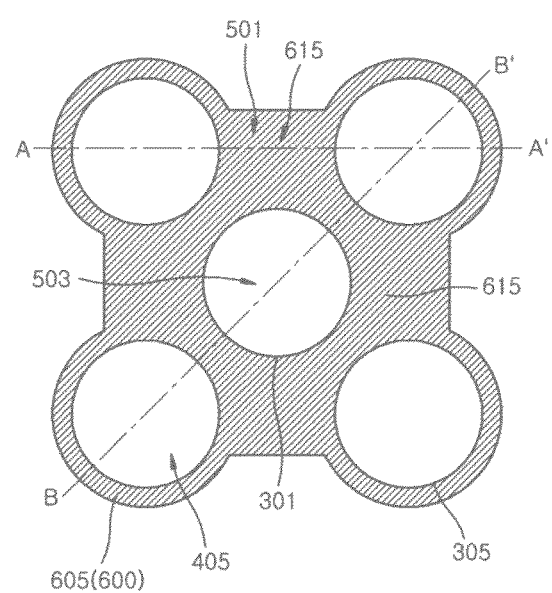
Figure 14A:
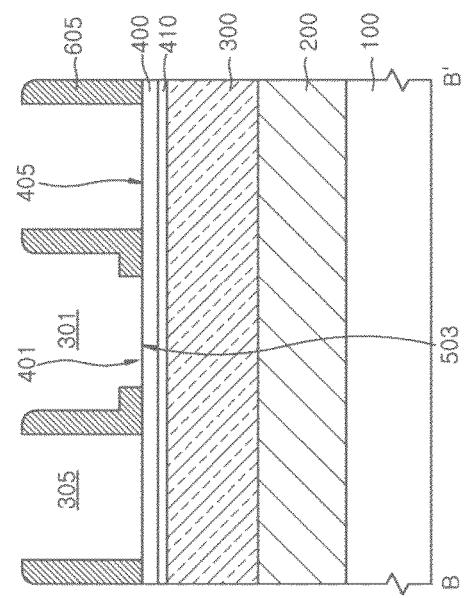
Figure 14B:
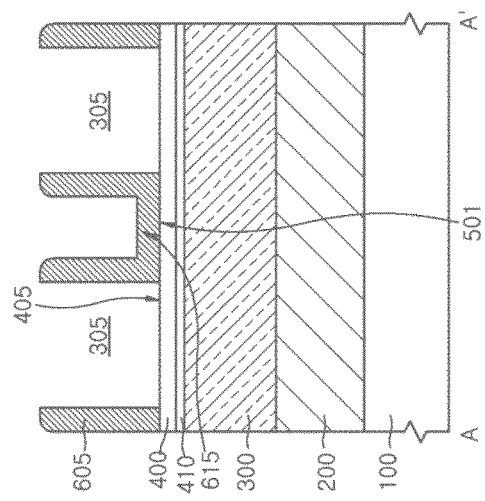

FIG. 13 is a plan view illustrating a step of forming second openings 305, and FIGS. 14a and 14b are cross-sectional views taken along lines A-A' and B-B' of FIG. 13. Referring to FIGS. 13, 14a, and 14b, the pillars 500 may be selectively removed to form second openings 305 whose shapes are defined by the first separation wall portion 605 of the separation wall layer 600. The second openings 305 may expose second portions 405 of underlying layer 400. When the pillars 500 are selectively removed to form the second openings 305, the first separation wall portion 605 and the portions 615 of the separation wall layer 600 may still exist. Thus, the first opening 301 and the second openings 305 may be separated from each other by the first separation wall portion 605 and the portions 615 of the separation wall layer 600. When the pillars 500 are selectively removed, the first domain 710 including the second separation wall 711 may also be removed. Alternatively, when the pillars 500 are selectively removed, the first domain 710 including the second separation wall 711 may still remain.

Figure 15:
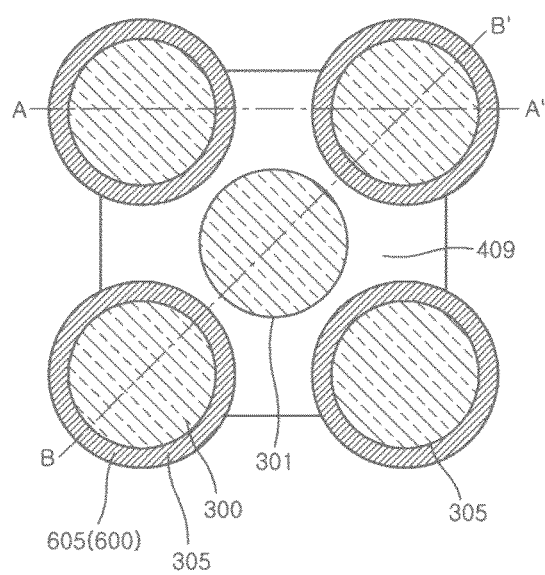
Figure 16A:
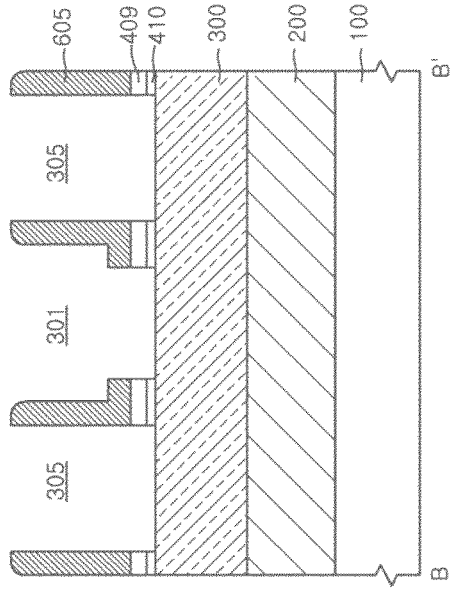
Figure 16B:
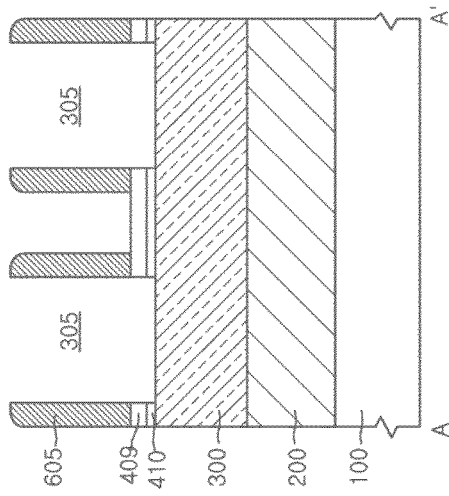

FIG. 15 is a plan view illustrating a step of forming a mask pattern 409, and FIGS. 16a and 16b cross-sectional views taken along lines A-A' and B-B' of FIG. 15, respectively. Referring to FIGS. 15, 16a and 16b, the first portion 401 and the second portions 405 of the underlying layer 400 may be etched to from the mask pattern 409. When the first portion 401 and the second portions 405 of the underlying layer 400 are etched, the first separation wall portion 605 and the portions 615 of the separation wall layer 600 may be used as etch masks. Further, when the first portion 401 and the second portions 405 of the underlying layer 400 are etched to form the mask pattern 409, the interfacial layer 410 may also be etched to have substantially the same shape as the mask pattern 409 in a plan view. As a result, portions of the hard mask layer 300 may be exposed by the mask pattern 409 and the etched interfacial layer 410.

Figure 17:
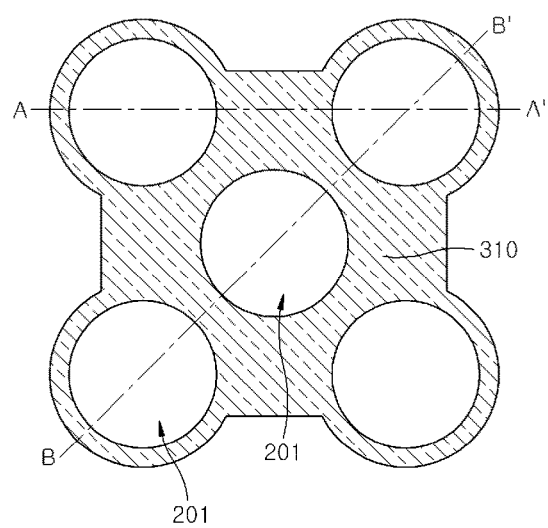
Figure 18:
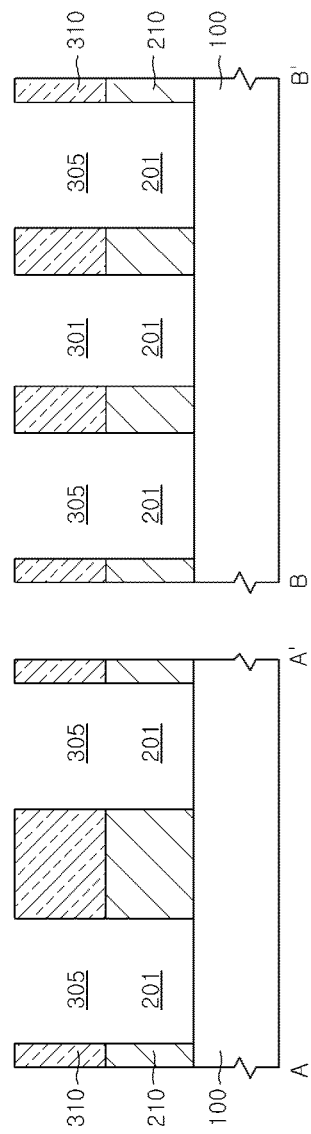

FIG. 17 is a plan view illustrating a step of forming a hard mask 310 and contact holes 201, and FIGS. 18a and 18b are cross-sectional views taken along lines A-A' and B-B' of FIG. 17, respectively. Referring to FIGS. 17, 18a, and 18b, the portions of the hard mask layer 300 exposed by the mask pattern (409 of FIGS. 16a and 16b) may be selectively etched and removed to form the hard mask 310 having the same planar shape as the mask pattern 409. That is, the hard mask 310 may also be formed to have the first opening 301 and the second openings 305 that expose portions of the etch target layer 200. The portions of the etch target layer 200 exposed by the hard mask 310 may be etched and removed to form an etch target pattern 210 having the contact holes 201. As a result, the contact holes 201 may be formed to be vertically aligned with the pillars 500 and the second domain 730. Because the second domain 730 is uniformly formed by a self-assembly of the BCP layer 700, the contact holes 201 may also be formed to be uniformly spaced apart from each other. That is, an array of the contact holes 201 may be formed to have a uniform pitch and a uniform size. The structure including the array of the contact holes 201 may be used in formation of an array of storage nodes or an array of storage node contacts of cell capacitors constituting a DRAM device. Alternatively, the structure including the array of the contact holes 201 may be used in formation of an array of lower electrodes contacting variable resistive layers of a PcRAM device or a ReRAM device.

Figure 19:
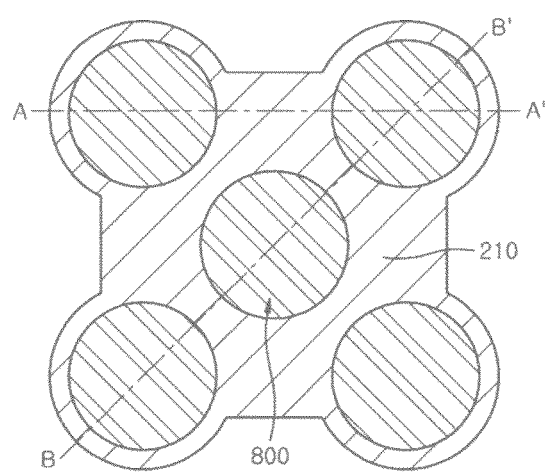
Figure 20:
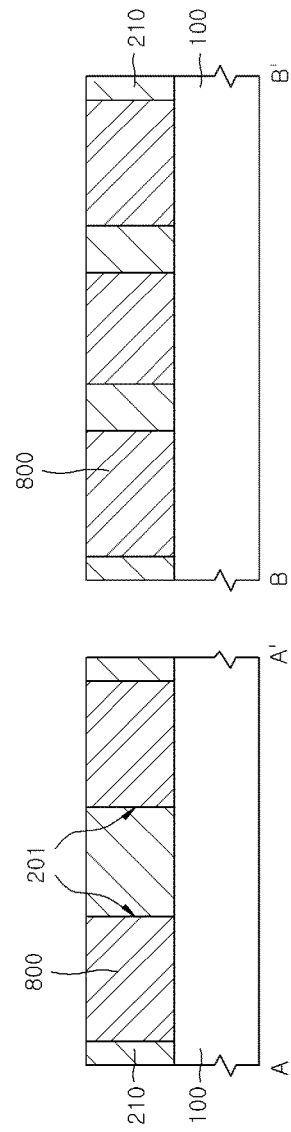

FIG. 19 is a plan view illustrating a step of forming an array of conductive electrodes 800, and FIGS. 20a and 20b are cross-sectional views taken along lines A-A' and B-B' of FIG. 19, respectively. Referring to FIGS. 19, 20a, and 20b, a conductive layer may be formed on the resultant structure illustrated in FIGS. 17, 18a, and 18b to fill the contact holes 201, and the conductive layer may be planarized until the etch target pattern 210 is exposed. As a result, the conductive electrodes 800 may be formed in respective contact holes 201. The conductive electrodes 800 may be used as storage node contacts or storage nodes of cell capacitors of a DRAM device. Alternatively, the conductive electrodes 800 may be used as lower electrodes of a ReRAM device or a PcRAM device.

Figure 21:
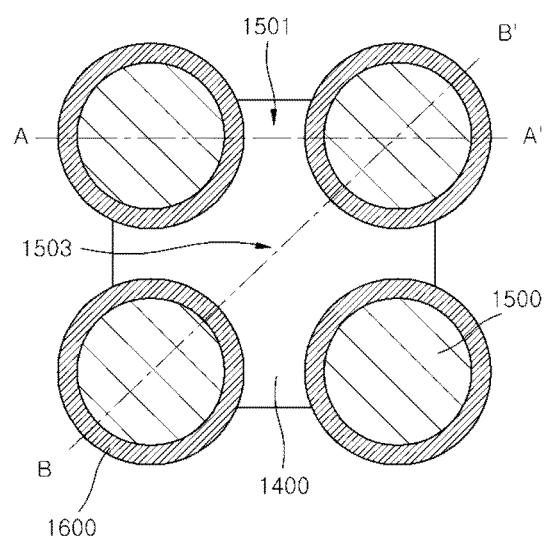
Figure 22A:
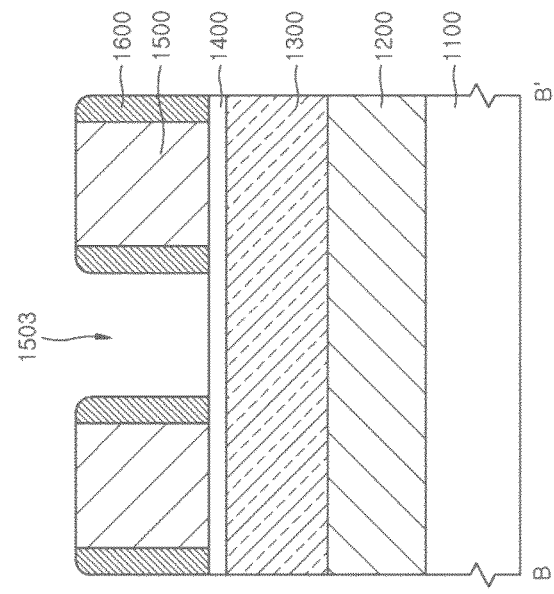
Figure 22B:
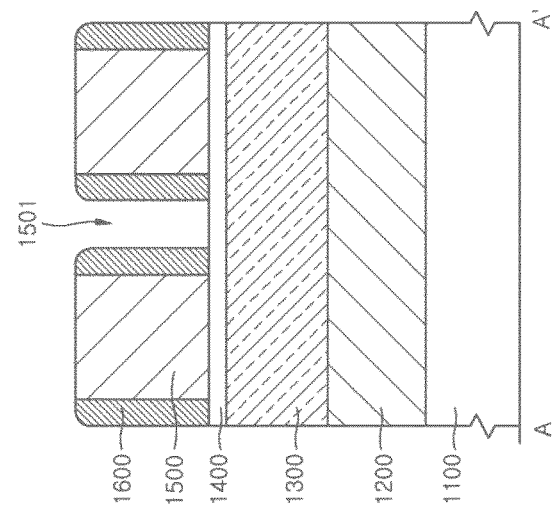

FIG. 21 is a plan view illustrating an array of pillars 1500 and first separation walls 1600, and FIGS. 22a and 22b are cross-sectional view taken along lines A-A' and B-B' of FIG. 21, respectively. Referring to FIGS. 21, 22a, and 22b, four pillars 1500 may be disposed at four vertex of a tetragon to constitute an array of the pillars 1500. In some embodiments, the array of the pillars 1500 may include three pillars located at three vertex of a triangle. According to the present embodiments, first gaps 1501 may be disposed between the pillars 1500 adjacent to each other in a row or in a column, and a second gap 1503 may be disposed between the pillars 1500 adjacent to each other in a diagonal direction. That is, one of the first gaps 1501 may be shown in a cross-sectional view taken along the line A-A' which is parallel with a row, and the second gap 1503 may be shown in a cross-sectional view taken along the line B-B' which is parallel with a diagonal direction. Since the four pillars 1500 are respectively located at four vertex of a tetragon, the second gap 1503 may be disposed in a central region of the tetragon. Although, in FIG. 21, the four pillars 1500 are located at four vertex of a tetragon, the present embodiment is not limited thereto. For example, in some embodiments, the pillars 1500 may include three pillars and the three pillars may be located at three vertex of a triangle.

The pillars 1500 may be formed on an underlying layer 1400 disposed on a semiconductor substrate 1100. Before forming the underlying layer 1400, an etch target layer 1200 and a hard mask layer 1300 may be sequentially formed on the semiconductor substrate 1100. The etch target layer 1200 may be formed of an interlayer insulation layer including a silicon oxide layer such as a tetra-ethyl-othor-silicate (TEOS) layer having a thickness of about 2200 angstroms. The hard mask layer 1300 may be formed to include an amorphous carbon layer having a thickness of about 1500 angstroms. The hard mask layer 1300 may be used as an etch mask layer when the etch target layer 1200 is patterned to form contact holes in a subsequent process. The underlying layer 1400 may be formed on the hard mask layer 1300. The underlying layer 1400 may be used as an etch mask layer when the hard mask layer 1300 is patterned in a subsequent process. The underlying layer 1400 may include a silicon oxynitride (SiON) layer having a thickness of about 200 angstroms. In some embodiments, the underlying layer 1400 may further include a silicon oxide ($SiO_x$) layer such as an undoped silicate glass (USG) layer having a thickness of about 200 angstroms. A pillar layer for providing the pillars 1500 may be formed on the underlying layer 1400 and include a high temperature spin on carbon (SOC) layer having a thickness of about 800 angstroms. The pillar layer may be patterned to form the array of the pillars 1500.

A separation wall layer may cover the pillars 1500, and the separation wall layer may be anisotropically etched to form the first separation walls 1600 having a spacer shape on sidewalls of the pillars 1500. The first separation walls 1600 may include an insulation layer having an etch selectivity different from the underlying layer 1400 and the pillars 1500. For example, the first separation walls 1600 may be formed by depositing an ultra low temperature oxide (ULTO) layer having a thickness of about 200 angstroms and by anisotropically etching the ULTO layer until top surfaces of the pillars 1500 and the underlying layer 1400 below the first and second gaps 1501 and 1503 are exposed. Since the first separation walls 1600 are formed to surround the sidewalls of the pillars 1500, each of the first separation walls 1600 may have a cylindrical shape.

Figure 23:
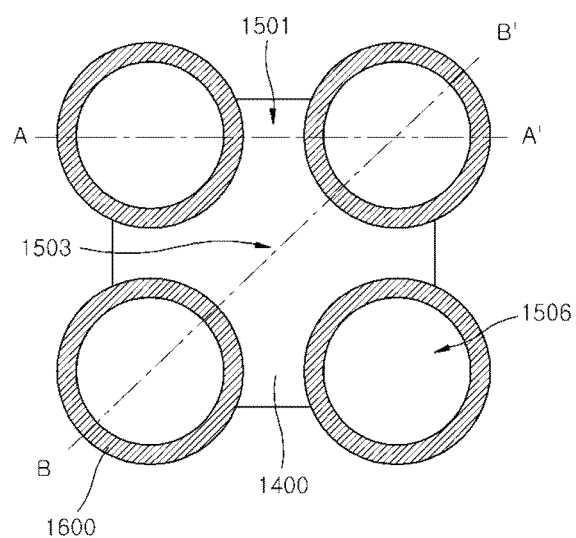
Figures 24A, 24B:
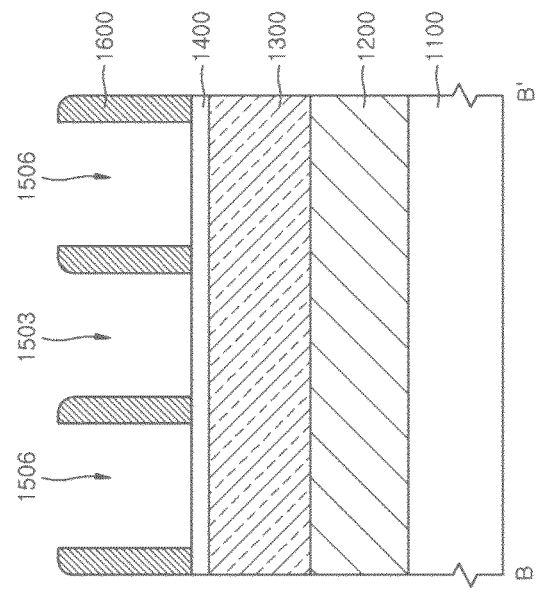

FIG. 23 is a plan view illustrating a step of removing the pillars 1500, and FIGS. 24a and 24b are cross-sectional views taken along lines A-A' and B-B' of FIG. 23. Referring to FIGS. 23, 24a, and 24b, the pillars 1500 may be selectively removed to form openings having a hole shape. As a result, an inside region 1506 surrounded by each first separation wall 1600 and an outside region (i.e., the first and second gaps 1501 and 1503) of the first separation walls 1600 may expose portions of the underlying layer 1400.

Figure 25:
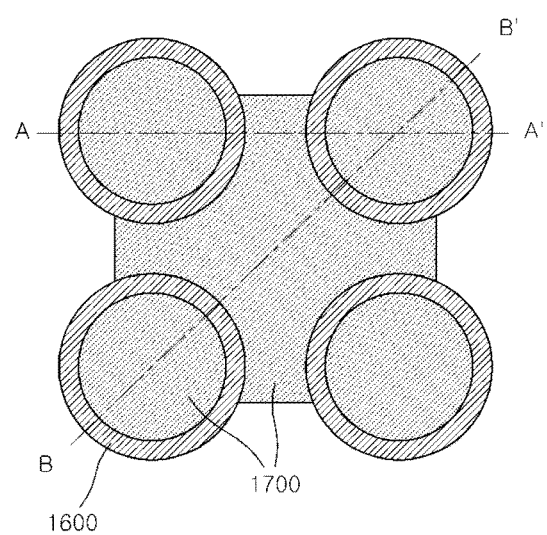

FIG. 25 is a plan view illustrating a step of forming a BCP layer 1700, and FIGS. 26a and 26b are cross-sectional views taken along lines A-A' and B-B' of FIG. 25. Referring to FIGS. 25, 26a, and 26b, the BCP layer 1700 may be coated to fill the inside and outside regions 1506, 1501 and 1503. The BCP layer 1700 may be formed by coating a polystyrene-poly(methyl meta acrylate) (PS-PMMA) co-polymer material or a silicon contained polystyrene-poly(di methyl siloxane) (Si contained PS-PDMS) co-polymer material.

Figure 27:
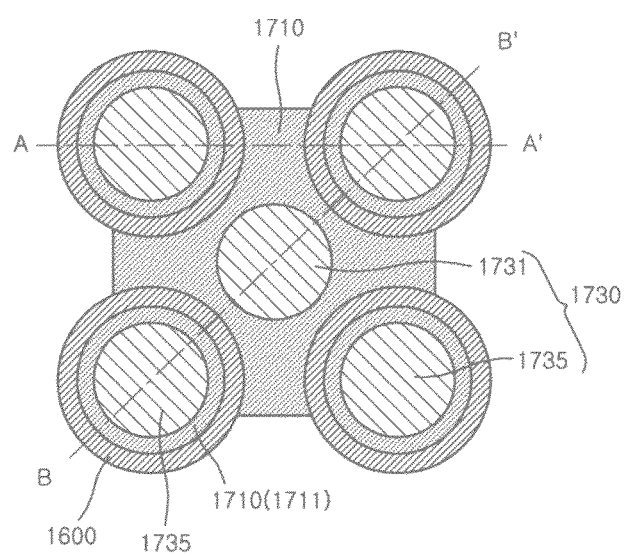
Figure 28B:
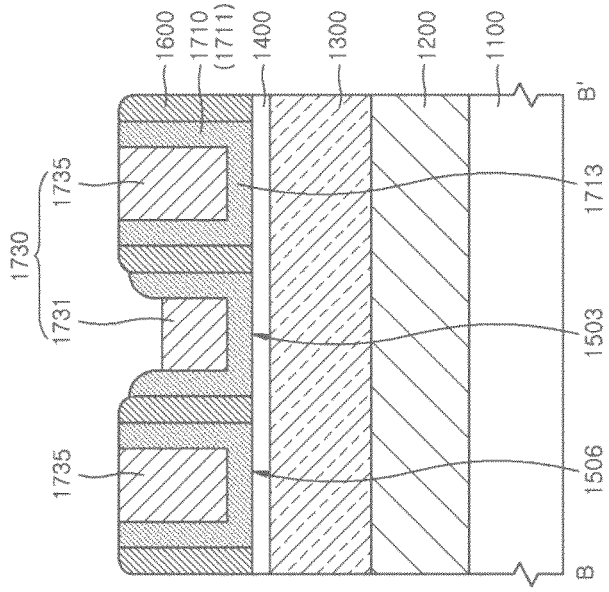
Figure 28A:
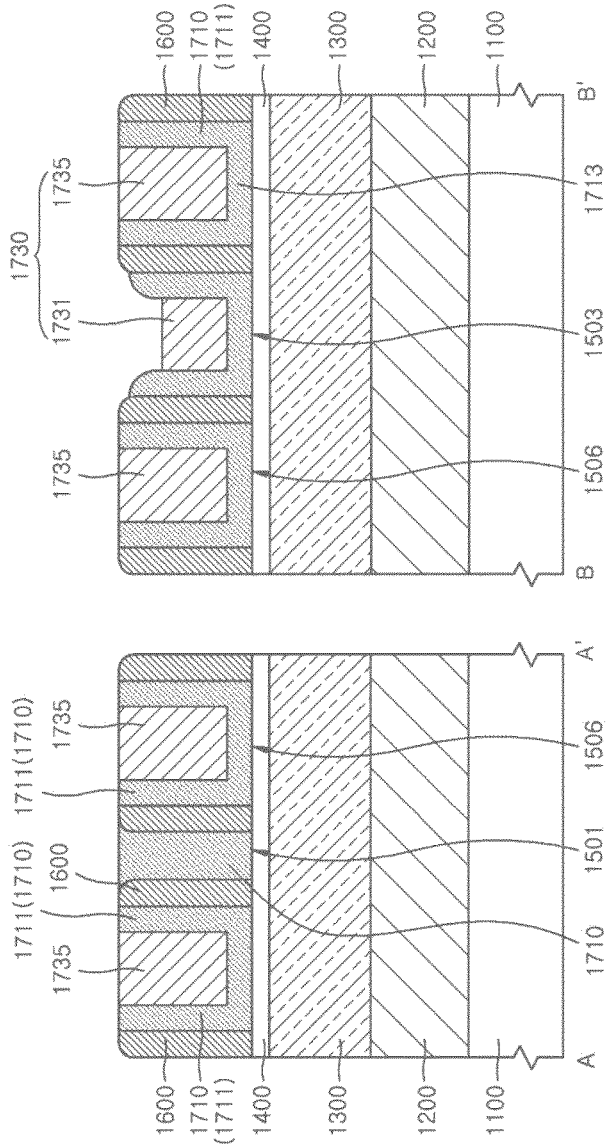

FIG. 27 is a plan view illustrating a step of phase-separating the BCP layer 1700, and FIGS. 28a and 28b are cross-sectional views taken along lines A-A' and B-B' of FIG. 27, respectively. Referring to FIGS. 27, 28a, and 28b, the BCP layer 1700 may be annealed and undergo phase-separation into first domains 1710 and second domains 1730. The first domains 1710 include second separation walls 1711 having a spacer shape and covering inner sidewalls and outer sidewalls of the first separation walls 1600. The second domains 1730 are separated from the first separation walls 1600 by the first domains 1710. The second domains 1730 may include (i) an outside region 1731 of the first separation walls 1600, including an inside of the second gap 1503, and (ii) an inside region 1735 of the first separation walls 1600, including the inside regions 1506. The first domains 1710 may include the second separation walls 1711 covering the inner sidewalls and the outer sidewalls of the first separation walls 1600 and extension portions 1713 formed over bottoms of regions 1506 and 1503. That is, each of the first domains 1710 may be formed to have a 'U'-shaped sectional view. Meanwhile, the first gaps 1501 may be filled with the first domain 1710. The second domains 1730 may be separated from each other by the first separation walls 1600 and the second separation walls 1711. Each of the second domains 1730 may have a post shape.

The BCP layer 1700 may include polystyrene (PS) blocks and poly-methyl-meta-acrylate (PMMA) blocks, and a volume ratio of the PS blocks to the PMMA blocks may be about 7:3. The first domains 1710 may be composed of the PS blocks which are phase-separated from the BCP layer 1700 and the second domains 1730 may be composed of the PMMA blocks which are phase-separated from the BCP layer 1700.

Referring again to FIGS. 27, 28a, and 28b, an array of the first separation walls 1600 may be formed on the underlying layer 1400, and the BCP layer 1700 may be formed to fill the inside regions 1506 surrounded by the first separation walls 1600 and the first and second gaps 1501 and 1503. Further, the BCP layer 1700 may be phase-separated to form (i) the first domains 1710 that include the second separation walls 1711 covering the inner sidewalls and the outer sidewalls of the first separation walls 1600 and the (ii) second domains 1730 that are spaced apart from the first separation walls 1600 by the first domains 1710. The structure illustrated in FIGS. 27, 28a, and 28b may be used in formation of an array of nano-scaled patterns constituting memory devices or logic devices. In such a case, the memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices and ferroelectric random access memory (FeRAM) devices.

Figure 29:
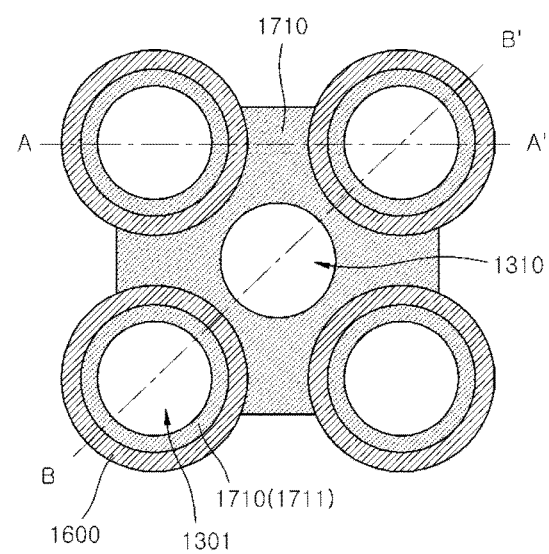
Figure 30A:
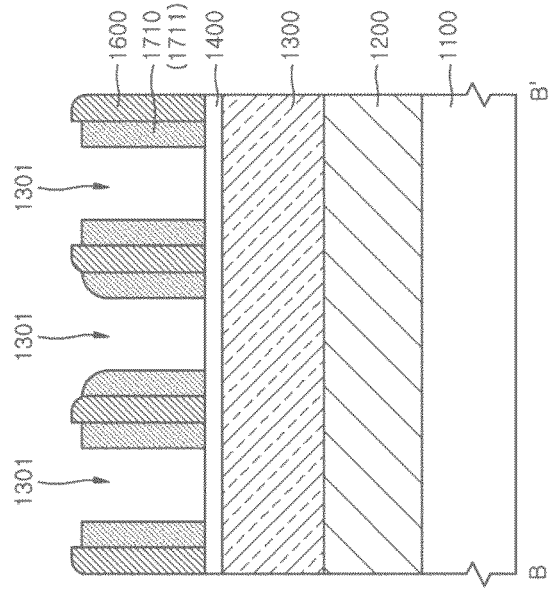
Figure 30B:
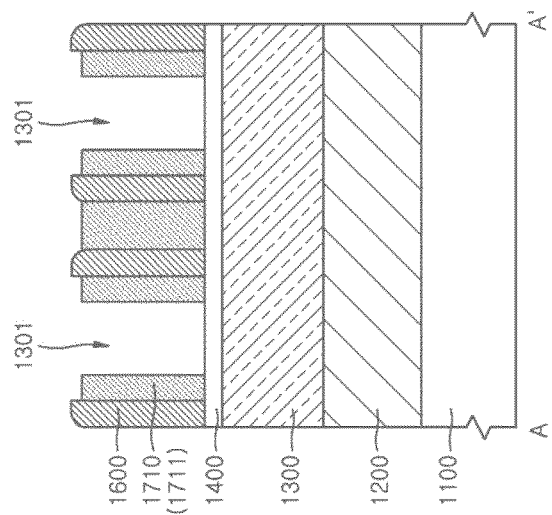

FIG. 29 is a plan view illustrating a step of forming openings 1301, and FIGS. 30a and 30b are cross-sectional views respectively taken along lines A-A' and B-B' of FIG. 29. Referring to FIGS. 29, 30a, and 30b, the second domain 1730 may be selectively removed to form the opening 1301 exposing the underlying layer 1400 in the inside regions 1506 (see FIG. 24) or exposing the underlying layer 1400 in the second gap 1503 (see FIG. 24). That is, the openings 1301 may be formed by selectively removing the PMMA blocks constituting the second domain 1730. As illustrated in FIGS. 29, 30a, and 30b, a shape of the opening 1301 may be defined by the first domains 1710. That is, the opening 1301 may be formed to have a vertical hole shape. When the second domains 1730 are etched and removed, the extension portions 1713 (see FIG. 28) of the first domains 1710 is exposed by the openings 1301, and then may also be removed to expose portions of the underlying layer 1400.

Figure 31:
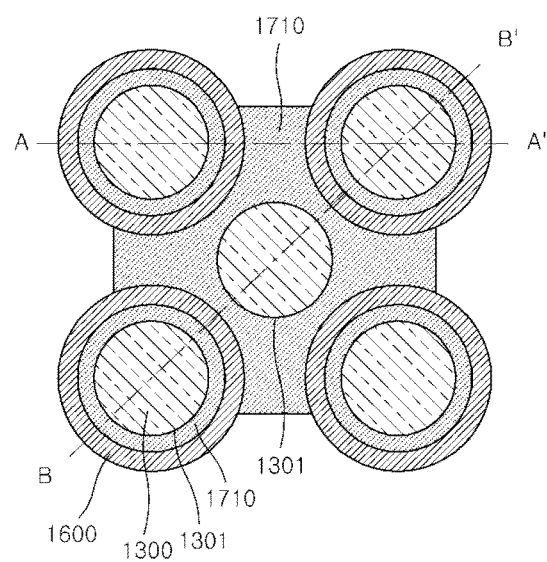
Figure 32:
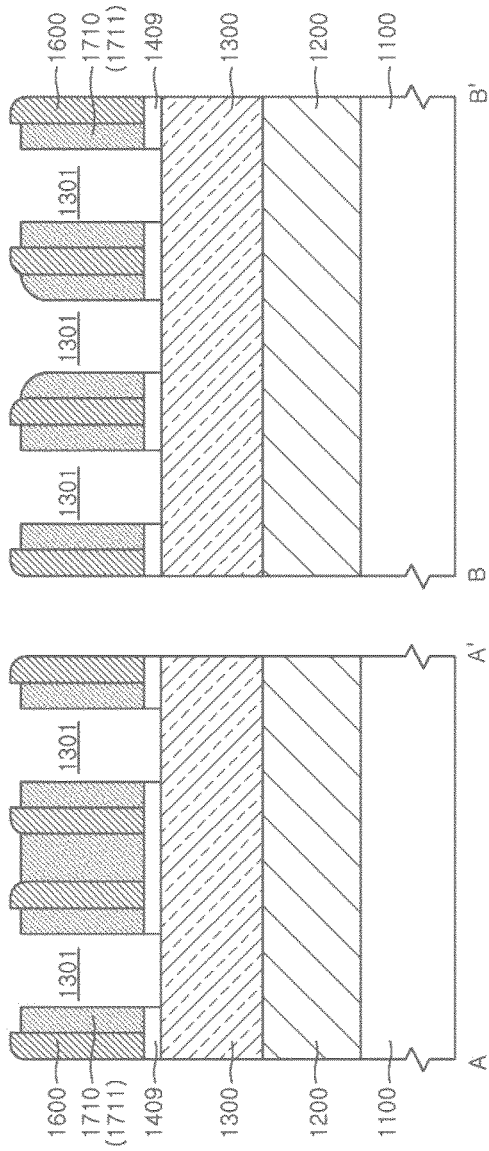

FIG. 31 is a plan view illustrating a step of forming a mask pattern 1409, and FIGS. 32a and 32b are cross-sectional views respectively taken along lines A-A' and B-B' of FIG. 31. Referring to FIGS. 31, 32a, and 32b, the exposed portions of the underlying layer 1400 may be selectively etched to from the mask pattern 1409. When the exposed portions of the underlying layer 1400 are etched, the first separation walls 1600 and the second separation walls 1711 may be used as etch masks. The mask pattern 1409 may expose portions of the hard mask layer 1300.

Figure 33:
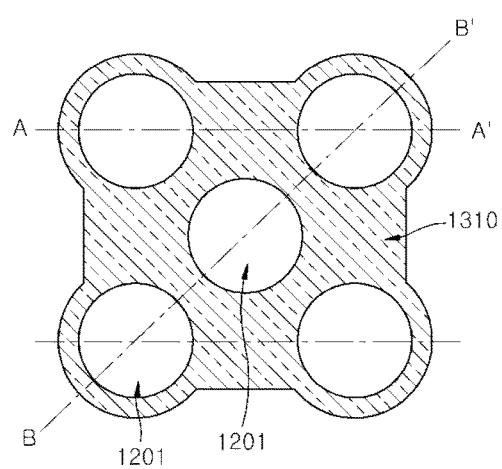
Figure 34:
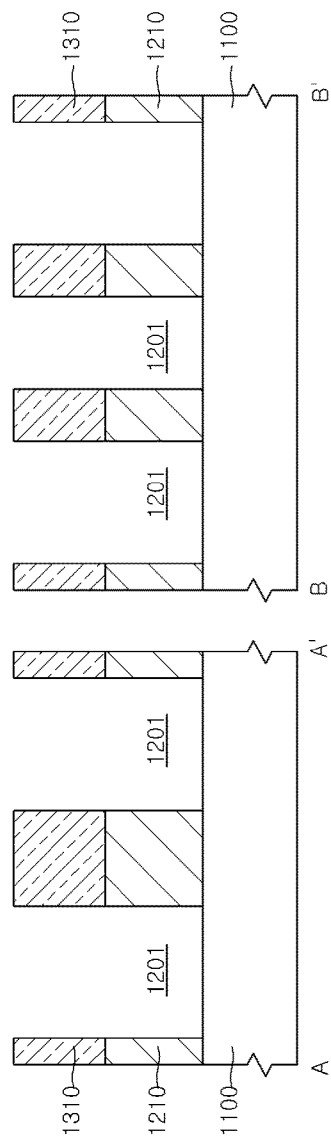

FIG. 33 is a plan view illustrating a step of forming a hard mask 1310 and contact holes 1201, and FIGS. 34a and 34b are cross-sectional views respectively taken along lines A-A' and B-B' of FIG. 33. Referring to FIGS. 33, 34a, and 34b, the hard mask layer 1300 and the etch target layer 1200 may be etched using the mask pattern 1409 (see FIG. 32) as an etch mask to form the hard mask 1310 and an etch target pattern 1210, resulting in contact holes 1201. Thus, the hard mask 1310 and the etch target pattern 1210 may be formed to have the same planar shape as the mask pattern 1409. As a result, the contact holes 1201 may be formed to be vertically with respect to a surface of the semiconductor substrate 1100.

Figure 35:
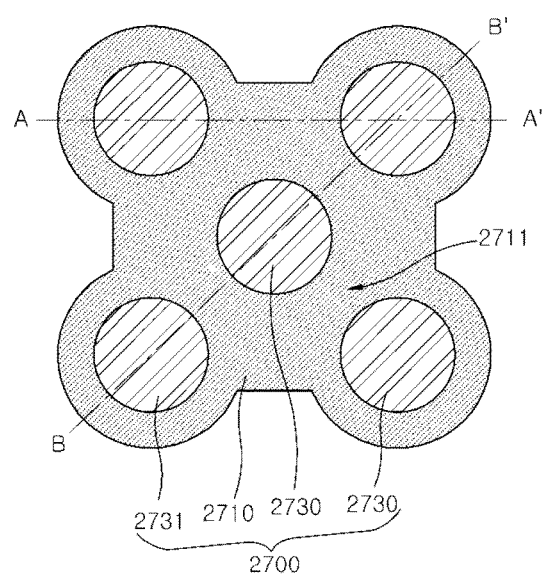

FIG. 35 is a plan view illustrating a step of phase-separating a BCP layer 2700, and FIGS. 36a and 36b are cross-sectional views respectively taken along lines A-A' and B-B' of FIG. 36. Referring to FIGS. 35, 36a, and 36b, four pillars 2500 may be disposed at four vertex of a tetragon to constitute an array of the pillars 2500. In some embodiments, the array of the pillars 2500 may include three pillars located at three vertex of a triangle. According to the present embodiments, first gaps may be disposed between two adjacent pillars 2500 in a row or in a column, and a second gap may be disposed between two adjacent pillars 2500 in a diagonal direction. Since the four pillars 2500 are respectively located at four vertex of a tetragon, the second gap may be disposed in a central region of the tetragon. Although the present embodiment is described in conjunction with an example that the four pillars 2500 are located at four vertex of a tetragon, the present embodiment is not limited thereto. For example, in some embodiments, the pillars 2500 may include three pillars and the three pillars may be located at three vertex of a triangle.

The pillars 2500 may be formed on an underlying layer 2400 disposed on a semiconductor substrate 2100. Before forming the underlying layer 2400, an etch target layer 2200 and a hard mask layer 2300 may be sequentially formed between the underlying layer 2400 and the semiconductor substrate 2100.

A separation wall layer may be formed to cover the pillars 2500, and the separation wall layer may be anisotropically etched to form the first separation walls 2600 having a spacer shape on sidewalls of the pillars 2500. The first separation walls 2600 may be formed of an insulation layer having an etch selectivity with respect to the underlying layer 2400 and the pillars 2500. For example, the first separation walls 2600 may be formed by depositing an ultra low temperature oxide (ULTO) layer having a thickness of about 200 angstroms and by anisotropically etching the ULTO layer until top surfaces of the pillars 2500 and the underlying layer 2400 are exposed. Since the first separation walls 2600 are formed to surround the sidewalls of the pillars 2500, each of the first separation walls 2600 may have a cylindrical shape.

A BCP layer 2700 may be formed on the pillars 2500 and the first separation walls 2600 to fill the first and second gaps between the pillars 2500. The BCP layer 2700 may be formed by coating a polystyrene-poly(methyl meta acrylate) (PS-PMMA) co-polymer material, a polystyrene-poly(di methyl siloxane) (PS-PDMS) co-polymer material, or a silicon contained polystyrene-poly(di methyl siloxane) (Si contained PS-PDMS) co-polymer material. That is, the BCP layer 2700 may be coated to fill the first and second gaps and to cover top surfaces of the pillars 2500.

The BCP layer 2700 may be annealed to be phase-separated into a first domain 2710 including a second separation wall 2711 covering the first separation walls 2600 and a second domain 2730 separated from the pillars 2500 by the first domain 2710. The first domain 2710 may be formed to fill the first gaps between the pillars 2500 disposed in a row or in a column direction. Further, the first domain 2710 may be formed to have a 'U'-shaped sectional view in the second gap which is located at a central region of the array of the four pillars 2500. The second domain 2730 may be formed to fill an inside region of the 'U'-shaped first domain 2710. That is, the second domain 2730 may be surrounded by the 'U'- shaped first domain 2710. As illustrated in the plan view of FIG. 35, the second domain 2730 may be separated from the pillars 2500 by the first domain 2710. Meanwhile, when the BCP layer 2700 is coated to cover the top surfaces of the pillars 2500, the BCP layer 2700 may be phase-separated to include third domains 2731 on the pillars 2500. The third domains 2731 may be composed of substantially the same polymer blocks as the second domain 2730. Thus, the second and third domains 2730 and 2731 may have a different phase from the first domain 2710.

The BCP layer 2700 may include polystyrene (PS) blocks and poly-di-methyl-siloxane (PDMS) blocks, and a ratio of the PS blocks to the PDMS blocks may be controlled by a volume ratio of the PS blocks to the PDMS blocks. The first domain 2710 may be composed of the PDMS blocks which are phase-separated from the BCP layer 2700. The second and third domains 2730 and 2731 may be composed of the PS blocks which are phase-separated from the BCP layer 2700.

Figure 37:
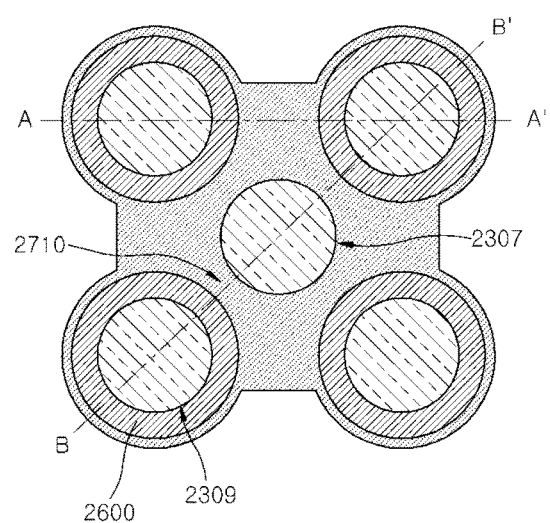
Figure 38B:
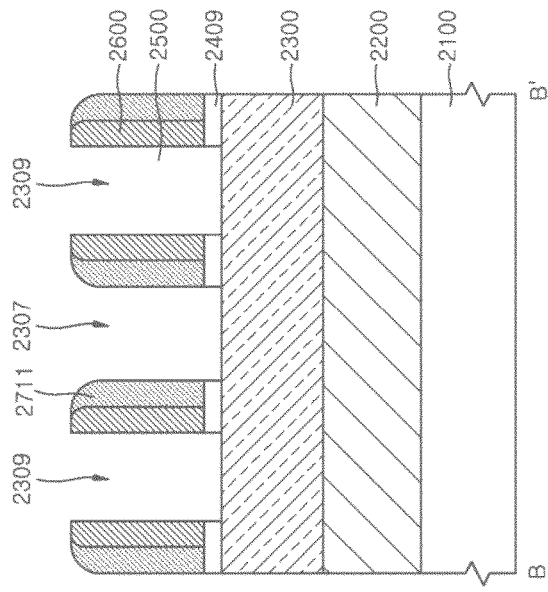
Figure 38A:
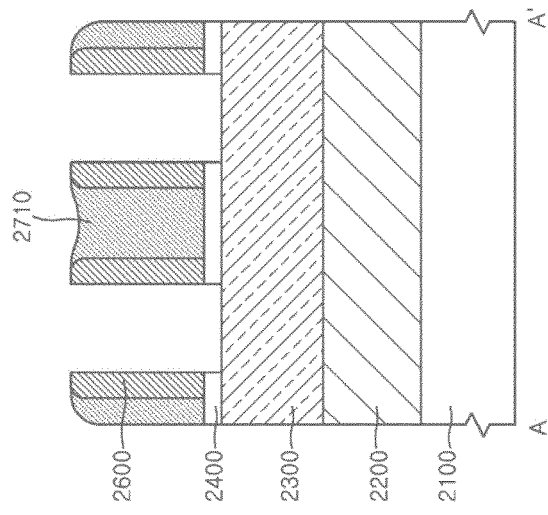

FIG. 37 is a plan view illustrating a step of forming first and second openings 2307 and 2309, and FIGS. 38a and 38b are cross-sectional views respectively taken along lines A-A' and B-B' of FIG. 37. Referring to FIGS. 37, 38a, and 38b, the second domain 2730 may be selectively removed to form the first opening 2307. When the second domain 2730 is selectively removed, the third domains 2731 may also be removed to expose the pillars 2500. The exposed pillars 2500 may then be selectively removed to form the second openings 2309.

That is, the first opening 2307 may be formed by selectively removing the second domain 2730 and the first domain 2710 below the second domain 2730. The second openings 2309 may be formed by removing the third domains 2731 and the pillars 2500. As illustrated in the plan view of FIG. 37, the first opening 2307 may be defined by a shape of the first domain 2710 and the second openings 2309 may be defined by shapes of the pillars 2500. The first and second openings 2307 and 2309 may expose portions of the underlying layer 2400. The exposed portions of the underlying layer 2400 may be selectively removed to form mask pattern 2409. Subsequently, although not shown in the drawings, the hard mask layer 2300 may be etched using the mask pattern 2409 as an etch mask to form a hard mask, and the etch target layer 2200 may be etched using the hard mask as an etch mask to form contact holes penetrating the etch target layer 2200.

Figure 39:
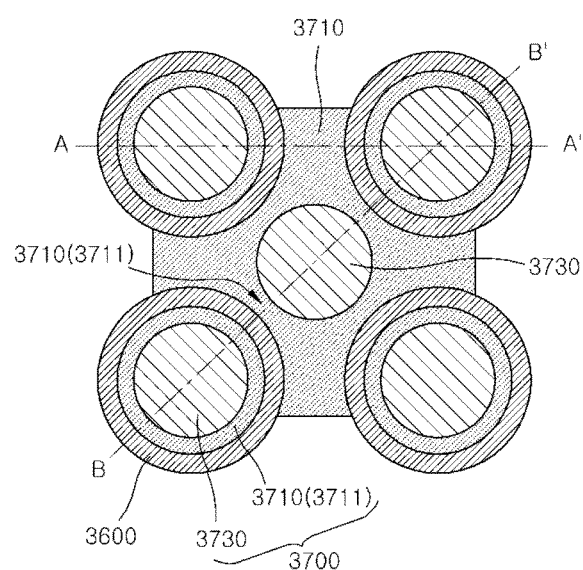
FIGS. 39 to 42B are schematic views illustrating a method of fabricating a semiconductor device according to yet another embodiment.
Figure 40A:
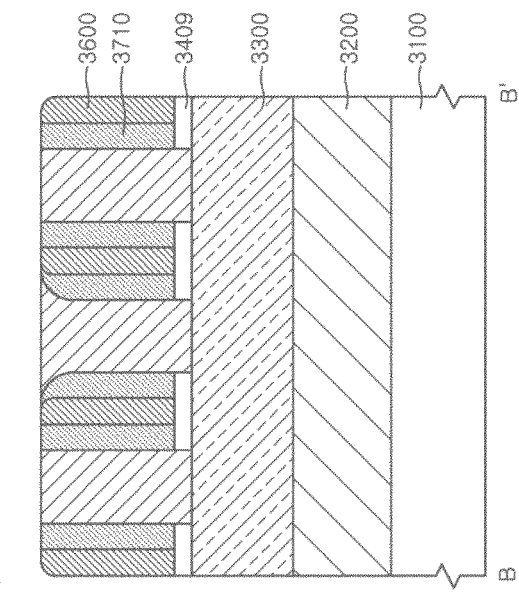
Figure 40B:
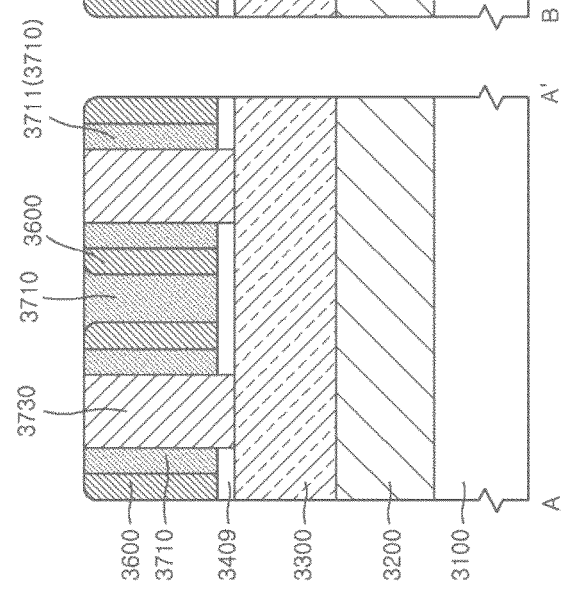

FIG. 39 is a plan view illustrating a step of phase-separating a BCP layer 3700, and FIGS. 40a and 40b cross-sectional views respectively taken along lines A-A' and B-B' of FIG. 39. Referring to FIGS. 39, 40a, and 40b, an array of first separation walls 3600 may be formed on an underlying layer disposed on a semiconductor substrate 3100. Each of the first separation walls 3600 may be formed to have a cylindrical shape. Specifically, an array of pillars may be formed on the underlying layer. The array of the pillars may include four pillars located at four vertex of a tetragon in a plan view. In some embodiments, the array of the pillars may include three pillars located at three vertex of a triangle. Before forming the underlying layer, an etch target layer 3200 and a hard mask layer 3300 may be sequentially formed on the semiconductor substrate 3100, and the underlying layer may be formed between the hard mask layer 3300 and the underlying layer. A separation wall layer may be formed to cover the pillars, and the separation wall layer may be anisotropically etched to form the first separation walls 3600 having a spacer shape on sidewalls of the pillars.

The first separation walls 3600 may be formed of an insulation layer having an etch selectivity with respect to the underlying layer formed of a silicon oxynitride (SiON) layer and the pillars formed of an SOC layer. For example, the first separation walls 3600 may be formed by depositing an ultra low temperature oxide (ULTO) layer having a thickness of about 200 angstroms and by anisotropically etching the ULTO layer until top surfaces of the pillars and the underlying layer are exposed. Since the first separation walls 3600 are formed to surround the sidewalls of the pillars, each of the first separation walls 3600 may have a cylindrical shape. The pillars may be selectively removed to form openings defined by the first separation walls 3600. Thus, inside regions (i.e., the openings) and outside regions of the first separation walls 3600 may expose the underlying layer.

The BCP layer 3700 may be coated to fill the inside regions (i.e., the openings) and the outside regions of the first separation walls 3600. The BCP layer 3700 may be formed by coating a silicon contained polystyrene-poly(di methyl siloxane) (Si contained PS-PDMS) co-polymer material. The BCP layer 3700 may be annealed to be phase-separated into first domains 3710 that includes second separation walls 3711 having spacer shapes covering inner and outer sidewalls of the first separation walls 3600 and second domains 3730 separated from each other by the first domains 3710.

The second domains 3730 may include (i) the region which is surrounded by the first domain 3710 and located at a central region of the array of the first separation walls 3600 and (ii) four regions each of which is surrounded by the first domains 3710 formed on the inner sidewalls of the first separation walls 3600, as illustrated in a plan view of FIG. 39. The second domains 3730 may be separated from each other by the first domains 3710 and the first separation walls 3600. Each of the second domains 3730 may be formed to have a post (or cylinder) shape, as illustrated in FIGS. 39, 40a, and 40b.

The BCP layer 3700 may include polystyrene (PS) blocks and poly-di-methyl-siloxane (PDMS) blocks, and a ratio of the PS blocks to the PDMS blocks may be controlled by a volume ratio of the PS blocks to the PDMS blocks. The first domains 3710 may be composed of the PDMS blocks which are phase-separated from the BCP layer 3700. The second domains 3730 may be composed of the PS blocks which are phase-separated from the BCP layer 3700.

Figure 41:
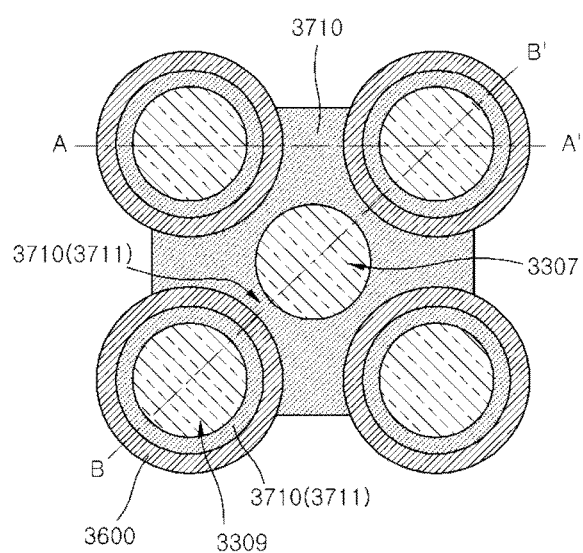
Figure 42A:
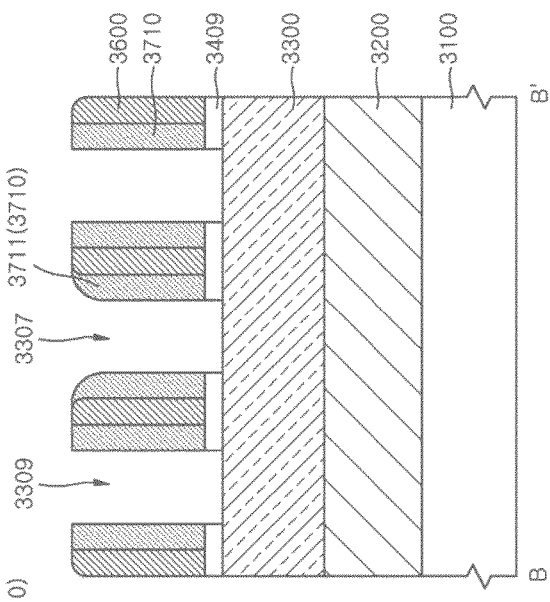
Figure 42B:
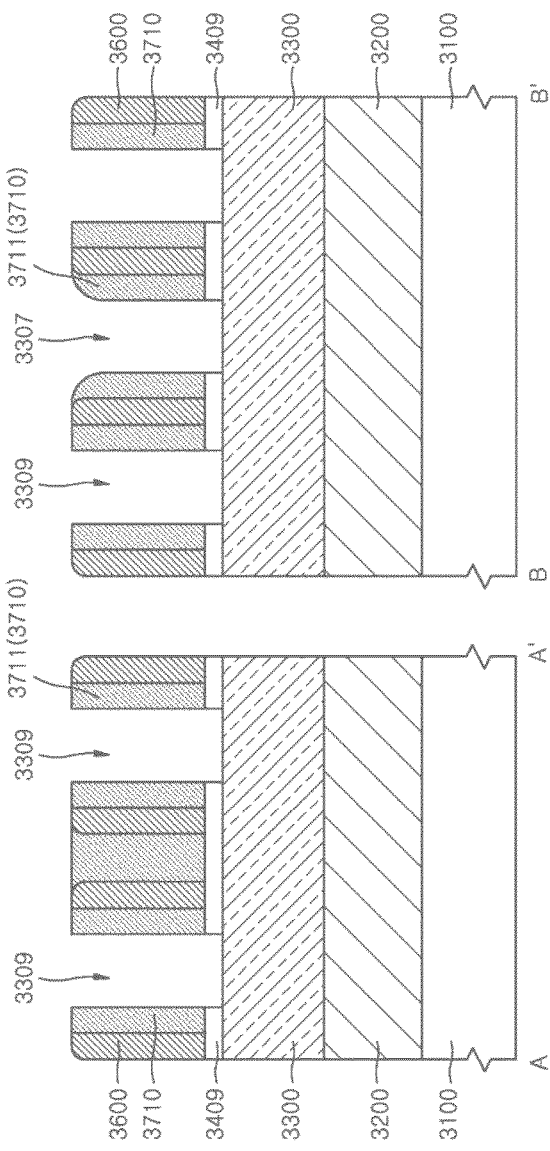

FIG. 41 is a plan view illustrating a step of forming outside and inside openings 3307 and 3309, and FIGS. 42a and 42b are cross-sectional views respectively taken along lines A-A' and B-B' of FIG. 41. Referring to FIGS. 41, 42a, and 42b, the second domains 3730 may be selectively removed to form the outside opening 3307 located at the outside region of the first separation walls 3600 and to form the inside openings 3309 located at the inside regions of the first separation walls 3600. That is, the openings 3307 and 3309 may be formed by selectively removing the PS blocks constituting the second domains 3730. As illustrated in the plan views of FIGS. 39 and 41, the openings 3307 and 3309 may be defined by the first domains 3710 and may be formed to have hole shapes penetrating the first domains 3710. The openings 3307 and 3309 may expose portions of the underlying layer. The exposed portions of the underlying layer may be selectively removed to form mask pattern 3409 exposing portions of the hard mask layer 3300.

Subsequently, although not shown in the drawings, the hard mask layer 3300 may be etched using the mask pattern 3409 as an etch mask to form a hard mask, and the etch target layer 3200 may be etched using the hard mask as an etch mask to form contact holes penetrating the etch target layer 3200.

Figure 43:
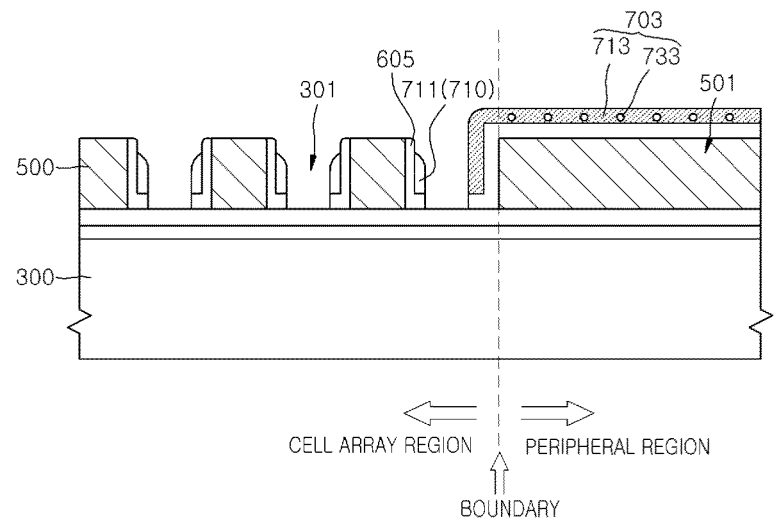
FIGS. 43 and 44 are cross-sectional views illustrating examples in which embodiments are applied to fabrication of semiconductor devices.
Figure 44:
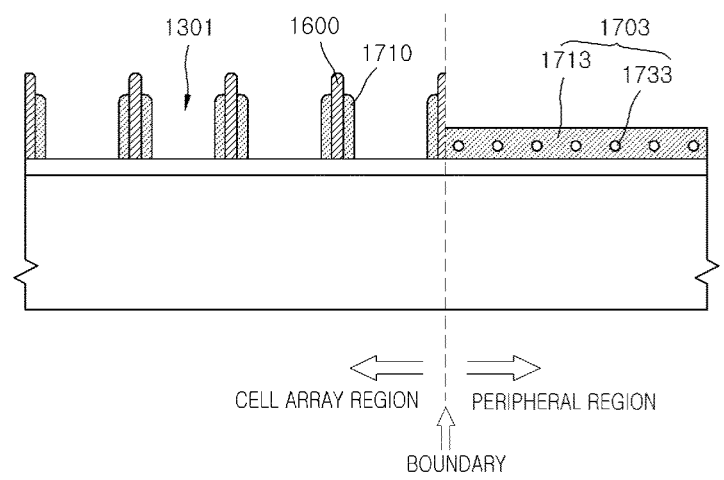

Referring to FIGS. 43 and 44, the methods of fabricating a semiconductor device according to the embodiments may be performed such that the openings and the contact holes are not formed in a peripheral region adjacent to a cell array region of the semiconductor device when the openings and the contact holes repeatedly arrayed in the cell array region are formed.

As illustrated in FIG. 43, when an array of the pillars 500 is formed in the cell array region, a peripheral blocking pattern 501 may be formed to cover an entire surface of the peripheral region adjacent to the cell array region. That is, when an SOC layer is formed on a semiconductor substrate 300 and the SOC layer is patterned to form the pillars 500 in the cell array region, the SOC layer on the peripheral region is not patterned due to the peripheral blocking pattern 501. Subsequently, a separation wall layer may be conformally formed, i.e., in a liner type, on an entire surface of the substrate including the pillars 500 and the peripheral blocking pattern 501. A BCP layer may be coated on the separation wall layer to fill spaces between the pillars 500. The BCP layer may be annealed to be phase-separated into first domains 710, providing second separation walls 711 and second domains (not shown) in the cell array region. When the BCP layer may be annealed, a peripheral BCP residue 703 covering the peripheral blocking pattern 501 may also be phase-separated into a first peripheral domain 713 and second peripheral domains 733. Subsequently, the second domains may be selectively removed to form openings 301 between the pillars 500 in the cell array region. When the second domains are selectively removed to form the openings 301, no openings are formed in the peripheral region because the phase-separated peripheral BCP residue 703 is disposed to cover an entire surface of the peripheral blocking pattern 501. The separation wall layer may then be anisotropically etched to form first separation walls 605 in the cell array region.

If fine patterns such as the openings 301 are formed in both the cell array region and the peripheral region, an extra mask and an extra etching process may be required to selectively remove the fine patterns formed in the peripheral region. In such a case, openings 301 adjacent to a boundary between the cell array region and the peripheral region may be damaged to have abnormal shapes when the openings 301 in the peripheral region are removed using the extra mask and the extra etching process. However, according to the embodiments, no openings are formed in the peripheral region even without use of the extra mask and the extra etching process. Thus, all the openings 301 in the cell array region may be uniformly formed in terms of the size.

As illustrated in FIG. 44, when an array of pillars is formed in the cell array region, a peripheral blocking pattern (501 of FIG. 43) is not formed in the peripheral region adjacent to the cell array region. Thus, when first separation walls 1600 are formed in the cell array region, no first separation wall 1600 is formed in the peripheral region. In such a case, when a BCP layer is formed on the substrate including the first separation walls 1600 and the BCP layer is annealed to be phase-separated into first domains 1710 and second domains (not shown) in the cell array region, a peripheral BCP residue 1703 on the peripheral region may also be phase-separated into a first peripheral domain 1713 and second peripheral domains 1733. Subsequently, the second domains may be selectively removed to form openings 1301 in the cell array region. When the second domains are selectively removed to form the openings 1301, no openings are formed in the peripheral region because the phase-separated peripheral BCP residue 1703 is disposed to cover an entire surface of the peripheral region.

If fine patterns such as the openings 1301 are formed in both the cell array region and the peripheral region, an extra mask and an extra etching process may be required to selectively remove the fine patterns formed in the peripheral region. In such a case, openings 1301 adjacent to a boundary between the cell array region and the peripheral region may be damaged to have abnormal shapes when the openings 1301 in the peripheral region are removed using the extra mask and the extra etching process. However, according to the embodiments, no openings are formed in the peripheral region even without use of the extra mask and the extra etching process. Thus, all the openings 1301 in the cell array region may be uniformly formed in terms of the size.

The methods of fabricating a semiconductor device according to the embodiments may be used in formation of an array of contact holes having a pitch size of about 38 nanometers or less. In addition, according to the embodiments, the contact holes may be uniformly formed without any deformation of the contact holes.

According to the embodiments described above, nano-sized structures or nano structures may be readily fabricated by forming a block co-polymer (BCP) layer on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, electronic/electric components for patterning nano-scaled interconnections, catalysts of solar cells and fuel cells, etch masks, organic light emitting diodes (OLEDs), and gas sensors.

The methods according to the aforementioned embodiments and structures formed thereby may be used in fabrication of integrated circuit (IC) chips. The IC chips may be supplied to users in a raw wafer form, in a bare die form, or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

What is claimed is:
1. A method of fabricating a semiconductor device, the method comprising:
 forming an array of pillars over an underlying layer;
 forming a separation wall layer over the pillars and the underlying layer;
 forming a block co-polymer (BCP) layer over the separation wall layer to fill gaps between the pillars; and
 phase-separating the BCP layer into first and second domains,
 wherein the first domains include second separation walls formed over sidewalls of the first separation wall layer, and
 wherein the second domains are separated from the pillars by the first domains.
2. The method of claim 1, further comprising:
 selectively removing the second domains to form first openings; and
 selectively removing the pillars to form second openings.
3. The method of claim 2, further comprising:
 etching the separation wall layer to expose top surfaces of the pillars; and
 etching the separation wall layer exposed by the first openings, before forming the second openings.

4. The method of claim 2, further comprising:
selectively etching the underlying layer exposed by the first and second openings to form a mask pattern.

5. The method of claim 4, further comprising:
sequentially forming an etch target layer and a hard mask layer over a semiconductor substrate before forming the underlying layer over the semiconductor substrate;
etching the hard mask layer using the mask pattern as an etch mask to form a hard mask;
etching the etch target layer using the hard mask as an etch mask to form contact holes; and
forming conductive electrodes in the contact holes.

6. The method of claim 5, wherein the conductive electrodes includes (i) storage node contacts or storage nodes of cell capacitors of a dynamic random access memory (DRAM) device or (ii) lower electrodes contacting variable resistive layers of a resistive random access memory (ReRAM) device.

7. The method of claim 5,
wherein the hard mask layer includes a carbon layer; and
wherein the underlying layer includes a silicon oxynitride (SiON) layer or a combination layer of a silicon oxynitride (SiON) layer and a silicon oxide layer.

8. The method of claim 1, wherein the BCP layer includes a polystyrene-poly(methyl meta acrylate) (PS-PMMA) co-polymer material or a silicon-contained polystyrene-poly(di methyl siloxane) (Si contained PS-PDMS) co-polymer material.

9. The method of claim 1, wherein the BCP layer is formed to expose top surfaces of the pillars.

10. The method of claim 1,
wherein a unit array of the pillars includes three pillars located at three vertex of a triangle or four pillars located at four vertex of a tetragon; and
wherein each of the second domains is formed at a central region of the triangle or the tetragon.

11. The method of claim 10,
wherein each of the first domains fills a gap between two adjacent pillars arranged in a row direction;
wherein each of the first domains defines a recessed region in the central region of the triangle or the tetragon; and
wherein each of the second domains fills the recessed region.

12. A method of fabricating a semiconductor device, the method comprising:
forming an array of pillars over an underlying layer;
forming first separation walls over sidewalls of the pillars;
forming a block co-polymer (BCP) layer filling gaps between the pillars; and
phase-separating the BCP layer into first and second domains,
wherein the first domains include second separation walls formed over the first separation walls, and
wherein the second domains are separated from the pillars by the first domains.

13. The method of claim 12, wherein forming the first separation walls includes:
forming a separation wall layer covering the pillars and the underlying layer; and
anisotropically etching the separation wall layer to expose top surfaces of the pillars and the underlying layer between the pillars.

14. The method of claim 12, further comprising:
selectively removing the second domains to form first openings; and
selectively removing the pillars to form second openings.

15. The method of claim 12, wherein the BCP layer is formed over the underlying layer exposed by the first separation walls.

16. The method of claim 12,
wherein a unit array of the pillars includes three pillars located at three vertex of a triangle or four pillars located at four vertex of a tetragon; and
wherein the second domains are formed at central regions of the triangles or the tetragons and on top surfaces of the pillars.

17. The method of claim 16,
wherein each of the first domains is formed to fill a gap between two adjacent pillars arranged in a row direction;
wherein each of the first domains defines a recessed region in the central region of the triangle or the tetragon; and
wherein each of the second domains fills the recessed region.

18. A method of fabricating a semiconductor device, the method comprising:
forming an array of first separation walls over an underlying layer, each of the first separation walls having a hollow cylindrical shape;
forming a block co-polymer (BCP) layer filling inside regions of the first separation walls and gaps between the first separation walls; and
phase-separating the BCP layer into first and second domains,
wherein the first domains includes second separation walls formed over inner sidewalls and outer sidewalls of the first separation walls, and
wherein the second domains are separated from each other by the first domains.

19. The method of claim 18, wherein forming the array of the first separation walls includes:
forming an array of pillars over the underlying layer;
forming a separation wall layer over the pillars and the underlying layer;
anisotropically etching the separation wall layer to form the first separation walls over sidewalls of the pillars; and
selectively removing the pillars.

20. The method of claim 18, further comprising:
selectively removing the second domains to form openings in inside regions and outside regions of the first separation walls.

* * * * *